(12) United States Patent
Kim et al.

(10) Patent No.: US 12,256,599 B2
(45) Date of Patent: Mar. 18, 2025

(54) DISPLAY APPARATUS HAVING A TRANSMISSIVE REGION WITH AUXILIARY LAYER

(71) Applicant: Samsung Display Co., Ltd., Yongin-si (KR)

(72) Inventors: Jaesik Kim, Yongin-si (KR); Joongu Lee, Yongin-si (KR); Jaeik Kim, Yongin-si (KR); Yeonhwa Lee, Yongin-si (KR); Chanho Moon, Yongin-si (KR); Sehoon Jeong, Yongin-si (KR); Jiyoung Choung, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/842,827

(22) Filed: Jun. 17, 2022

(65) Prior Publication Data

US 2022/0392975 A1  Dec. 8, 2022

Related U.S. Application Data

(62) Division of application No. 16/854,773, filed on Apr. 21, 2020, now Pat. No. 11,367,761.

(30) Foreign Application Priority Data

Apr. 24, 2019  (KR) .................. 10-2019-0048029
Feb. 20, 2020  (KR) .................. 10-2020-0021136

(51) Int. Cl.
*H10K 59/12*  (2023.01)
*H10K 30/82*  (2023.01)
(Continued)

(52) U.S. Cl.
CPC ............. *H10K 59/12* (2023.02); *H10K 30/82* (2023.02); *H10K 71/00* (2023.02); *H10K 59/35* (2023.02);
(Continued)

(58) Field of Classification Search
CPC ...... H10K 59/12; H10K 59/35; H10K 59/353; H10K 59/121; H10K 59/123;
(Continued)

(56) References Cited

U.S. PATENT DOCUMENTS 6,683,666 B1 * 1/2004 Jang .................. G02F 1/133555
                                                438/30
7,482,746 B2    1/2009 Ogawa et al.
(Continued)

FOREIGN PATENT DOCUMENTS

CN  101106156 A  1/2008
CN  103811671 A  5/2014
(Continued)

OTHER PUBLICATIONS

Ex Parte Quayle Action mailed Sep. 27, 2021, in U.S. Appl. No. 16/854,773.
(Continued)

*Primary Examiner* — Ida M Soward
(74) *Attorney, Agent, or Firm* — Womble Bond Dickinson (US) LLP

(57) ABSTRACT

A display apparatus includes: a first substrate and a display unit. The display unit includes a display region and a transmissive region. The display unit further includes: an auxiliary layer disposed in correspondence with the transmissive region; and a second electrode disposed in correspondence with the display region and at least a portion of the transmissive region. The auxiliary layer includes a first material, the second electrode includes a second material,
(Continued)

and the first material and the second material each satisfy Equation 1 below: <Equation 1> $ST2-ST1>0$ mJ/m$^2$, wherein, in Equation 1, ST1 is a surface energy of the first material at 25° C., and ST2 is a surface energy of the second material at 25° C.

9 Claims, 24 Drawing Sheets

(51) Int. Cl.
*H10K 59/35* (2023.01)
*H10K 71/00* (2023.01)
*H10K 59/80* (2023.01)
*H10K 102/00* (2023.01)

(52) U.S. Cl.
CPC ..... *H10K 59/353* (2023.02); *H10K 59/80522* (2023.02); *H10K 2102/351* (2023.02); *H10K 2102/361* (2023.02)

(58) Field of Classification Search
CPC .. H10K 59/1213; H10K 59/124; H10K 30/82; H10K 50/822; H10K 50/824; H10K 50/80522
See application file for complete search history.

(56) References Cited

U.S. PATENT DOCUMENTS

| | | | |
|---|---|---|---|
| 7,521,716 B2 | 4/2009 | Ando et al. | |
| 8,421,342 B2 | 4/2013 | Hong | |
| 8,530,910 B2 | 9/2013 | Song et al. | |
| 8,569,762 B2 | 10/2013 | Ha et al. | |
| 8,629,463 B2* | 1/2014 | Chung | H10K 59/121 |
| | | | 257/E51.019 |
| 8,638,030 B2 | 1/2014 | Lee et al. | |
| 8,860,010 B2 | 10/2014 | Ha et al. | |
| 8,957,151 B2 | 2/2015 | Tsutsui et al. | |
| 8,994,010 B2 | 3/2015 | Choi et al. | |
| 9,081,122 B2 | 7/2015 | Shin et al. | |
| 9,088,004 B2 | 7/2015 | Chung et al. | |
| 9,159,772 B2 | 10/2015 | Ha et al. | |
| 9,263,711 B2 | 2/2016 | Choi et al. | |
| 9,406,899 B2 | 8/2016 | Chung et al. | |
| 9,647,045 B2* | 5/2017 | Jung | H10K 59/121 |
| 9,704,935 B2 | 7/2017 | Kim | |
| 10,109,698 B2 | 10/2018 | Kang et al. | |
| 10,700,304 B2* | 6/2020 | Helander | H10K 50/824 |
| 11,043,636 B2 | 6/2021 | Helander et al. | |
| 2003/0025859 A1 | 2/2003 | Moon et al. | |
| 2004/0114074 A1 | 6/2004 | Yamamoto | |
| 2004/0169793 A1 | 9/2004 | Ino et al. | |
| 2006/0027804 A1* | 2/2006 | Yamazaki | H01L 27/124 |
| | | | 257/E27.111 |
| 2006/0202615 A1* | 9/2006 | Murakami | H10K 50/84 |
| | | | 313/506 |
| 2006/0231858 A1* | 10/2006 | Akimoto | H10K 59/131 |
| | | | 438/149 |
| 2006/0255719 A1* | 11/2006 | Oikawa | H05B 33/10 |
| | | | 313/506 |
| 2008/0012477 A1 | 1/2008 | Koo et al. | |
| 2011/0175097 A1 | 7/2011 | Song et al. | |
| 2011/0220922 A1 | 9/2011 | Kim et al. | |
| 2012/0104422 A1* | 5/2012 | Lee | H10K 50/82 |
| | | | 438/34 |
| 2012/0267611 A1 | 10/2012 | Chung et al. | |
| 2012/0313099 A1 | 12/2012 | Chung et al. | |
| 2013/0147851 A1 | 6/2013 | Yim et al. | |
| 2013/0161656 A1* | 6/2013 | Choi | H10K 59/131 |
| | | | 438/34 |
| 2013/0328022 A1* | 12/2013 | Choi | H10K 71/00 |
| | | | 438/46 |
| 2014/0145156 A1* | 5/2014 | Choi | H10K 71/621 |
| | | | 438/34 |
| 2015/0028298 A1* | 1/2015 | Chung | H10K 59/353 |
| | | | 438/34 |
| 2015/0076456 A1 | 3/2015 | Choi et al. | |
| 2015/0144891 A1* | 5/2015 | Park | H10K 50/818 |
| | | | 257/40 |
| 2015/0194638 A1* | 7/2015 | Choi | H10K 59/12 |
| | | | 438/34 |
| 2015/0228700 A1* | 8/2015 | Cho | H10K 50/86 |
| | | | 257/40 |
| 2015/0280166 A1* | 10/2015 | Chung | H10K 59/121 |
| | | | 257/40 |
| 2016/0099438 A1* | 4/2016 | Cho | H10K 59/124 |
| | | | 257/40 |
| 2016/0133680 A1 | 5/2016 | Lee et al. | |
| 2016/0233289 A1* | 8/2016 | Son | H10K 59/124 |
| 2016/0300902 A1* | 10/2016 | You | H10K 59/121 |
| 2017/0077209 A1* | 3/2017 | Kim | H10K 59/1213 |
| 2017/0084881 A1* | 3/2017 | Choi | H10K 71/00 |
| 2017/0148860 A1* | 5/2017 | Park | H10K 59/121 |
| 2017/0221976 A1* | 8/2017 | Park | H10K 77/10 |
| 2018/0083221 A1* | 3/2018 | Kim | H10K 50/828 |
| 2018/0108685 A1* | 4/2018 | Kim | H10K 59/121 |
| 2018/0145118 A1* | 5/2018 | Kim | H10K 59/121 |
| 2018/0190944 A1 | 7/2018 | Lee et al. | |
| 2018/0277592 A1 | 9/2018 | Moon et al. | |
| 2018/0277613 A1* | 9/2018 | Choi | H10K 59/124 |
| 2018/0301658 A1* | 10/2018 | Chung | H10K 50/17 |
| 2019/0006446 A1 | 1/2019 | Chung et al. | |
| 2019/0131365 A1* | 5/2019 | Jung | H10K 50/8426 |
| 2019/0173058 A1* | 6/2019 | Choi | H10K 59/121 |
| 2020/0098843 A1 | 3/2020 | Jeon et al. | |
| 2022/0005878 A1 | 1/2022 | Lee et al. | |

FOREIGN PATENT DOCUMENTS

| | | |
|---|---|---|
| JP | H9-222503 A | 8/1997 |
| JP | 2007-134481 A | 5/2007 |
| JP | 2010-54785 A | 3/2010 |
| JP | 2011-150992 A | 8/2011 |
| JP | 2012-15092 A | 1/2012 |
| JP | 2013-258144 A | 12/2013 |
| JP | 5967969 | 8/2016 |
| JP | 2018-41759 A | 3/2018 |
| KR | 10-0754096 | 8/2007 |
| KR | 10-2011-0085780 A | 7/2011 |
| KR | 10-2013-0138883 A | 12/2013 |
| KR | 10-2014-0093536 | 7/2014 |
| KR | 10-2016-0114754 | 10/2016 |
| KR | 10-2017-0129318 | 11/2017 |
| KR | 10-2018-0067448 | 6/2018 |
| KR | 10-2018-0108979 | 10/2018 |

OTHER PUBLICATIONS

Notice of Allowance issued Feb. 22, 2022, in U.S. Appl. No. 16/854,773.

* cited by examiner

DISPLAY APPARATUS HAVING A TRANSMISSIVE REGION WITH AUXILIARY LAYER

CROSS-REFERENCE TO RELATED APPLICATIONS

This application claims is a Divisional of U.S. patent application Ser. No. 16/854,773, filed Apr. 21, 2020, which claims priority from and the benefit of Korean Patent Application No. 10-2019-0048029, filed on Apr. 24, 2019 and No. 10-2020-0021136, filed on Feb. 20, 2020, each of which is hereby incorporated by reference for all purposes as if fully set forth herein.

BACKGROUND

Field

Implementations of the invention relate generally to a display apparatus and a method of manufacturing the same, and more specifically, to a display apparatus having a light transmissive region and a method of manufacturing the same.

Discussion of the Background

Recently, display apparatus have been used for various purposes. In addition, display apparatus have become thinner and lighter, and thus the range of use thereof is becoming broader.

As an example, studies are being conducted to implement transmissibility and transparency in display apparatus. In particularly, attempts have been made to form transparent display apparatus by making a thin-film transistor or a display panel included in the display apparatus transparent.

To implement such transparent display apparatus, it is necessary to optimize various parameters such as the composition, arrangement, thickness, and the like of various materials, including a substrate, an electrode, an insulating film, a capping film, and the like.

The above information disclosed in this Background section is only for understanding of the background of the inventive concepts, and, therefore, it may contain information that does not constitute prior art.

SUMMARY

Applicant recognized that in the case of a transparent organic light-emitting display apparatus, a plurality of conductive films and insulating films, each including different materials, are stacked, thereby degrading optimal characteristics (e.g., transmittance) and the desired transmissibility or transparency may not be easily obtained.

Display apparatus constructed according to the principles and illustrative implementations of the invention and methods of manufacturing the same have high transmittance of external light. For example, high light transmittance may be obtained by not forming a second electrode (e.g., a common electrode) in a transmissive region in the display apparatus or by forming it to have a thin thickness.

Additional features of the inventive concepts will be set forth in the description which follows, and in part will be apparent from the description, or may be learned by practice of the inventive concepts.

According to an aspect of the invention, a display apparatus includes: a first substrate and a display unit. The display unit includes a display region and a transmissive region. The display unit further includes: an auxiliary layer disposed in correspondence with the transmissive region; and a second electrode disposed in correspondence with the display region only. The auxiliary layer includes a first material, the second electrode includes a second material, and the first material and the second material each satisfy Equation 1 below: <Equation 1> $ST2-ST1>0$ mJ/m$^2$, wherein, in Equation 1, ST1 is a surface energy of the first material at 25° C., and ST2 is a surface energy of the second material at 25° C.

The second electrode may be absent from the transmissive region.

ST1 may be greater than about 0 mJ/m$^2$ and about 30 mJ/m$^2$ or less.

The first material may include about 20 at % or more of fluorine.

The first material may include a fluorine-containing silane compound, a fluorine-based polymer compound, or any combination thereof.

The second material may include magnesium (Mg), silver (Ag), aluminum (Al), lithium (Li), calcium (Ca), indium (In), or any combination thereof.

According to another aspect of the invention, the display apparatus includes: a first substrate and a display unit. The display unit includes a display region and a transmissive region. The display unit further includes: an auxiliary layer disposed in correspondence with the transmissive region; and a second electrode disposed in correspondence with the display region and at least a portion of the transmissive region. The auxiliary layer includes a first material, the second electrode includes a second material, and the first material and the second material each satisfy Equation 1 below: <Equation 1> $ST2-ST1>0$ mJ/m$^2$, wherein, in Equation 1, ST1 is a surface energy of the first material at 25° C., and ST2 is a surface energy of the second material at 25° C.

The second electrode may be disposed in correspondence with the display region and all of the transmissive region, a first portion of the second electrode may be disposed in correspondence with the display region, a second portion of the second electrode may be disposed in correspondence with the transmissive region, and a thickness of the first portion ($T_1$) and a thickness of the second portion ($T_2$) may each satisfy Equation 2 below: <Equation 2> $T_1>T_2$.

$T_2$ may be greater than about 0 nm and about 1 nm or less.

The second electrode may be disposed in correspondence with the display region and a portion of the transmissive region, A portion of the second electrode disposed in correspondence with the portion of the transmissive region may include a plurality of particles including the second material.

A thickness of the portion of the second electrode disposed in correspondence with the display region may be greater than an average diameter of the plurality of particles.

ST1 may be greater than about 0 mJ/m$^2$ and about 30 mJ/m$^2$ or less.

The first material may include about 20 at % or more of fluorine.

The first material may include a fluorine-containing silane compound, a fluorine-based polymer compound, or any combination thereof.

The second material may include magnesium (Mg), silver (Ag), aluminum (Al), lithium (Li), calcium (Ca), indium (In), or any combination thereof.

The display apparatus may further include a first electrode and an intermediate layer, and the intermediate layer may be interposed between the first electrode and the second electrode.

According to still another aspect of the invention, a method of manufacturing a display apparatus, the method includes the steps of: providing a first substrate; and providing a display unit on the first substrate, wherein the display unit includes a display region and a transmissive region. The step of providing the display unit includes the steps of: providing an auxiliary layer on the transmissive region only; and providing a second electrode on the display region or on both the display region and the transmissive region. The auxiliary layer includes a first material. The second electrode includes a second material, and the first material and the second material each satisfy Equation 1 below: <Equation 1> ST2−ST1>0 mJ/m$^2$, wherein, in Equation 1, ST1 is a surface energy of the first material at 25° C., and ST2 is a surface energy of the second material at 25° C.

The second electrode may be provided by depositing the second material by using an open mask.

The display apparatus may further include a first electrode and an intermediate layer. The intermediate layer may be provided on the first electrode. The auxiliary layer may be provided on the transmissive region only, and then, the second electrode may be provided on the intermediate layer or on both the intermediate layer and the auxiliary layer.

The display apparatus further includes a first electrode and an intermediate layer. The auxiliary layer may be provided on the transmissive region only, and then, the intermediate layer may be provided on the first electrode, and the second electrode may be provided on the intermediate layer or on both the intermediate layer and the auxiliary layer.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate illustrative embodiments of the invention, and together with the description serve to explain the inventive concepts.

DETAILED DESCRIPTION

Figure 1:
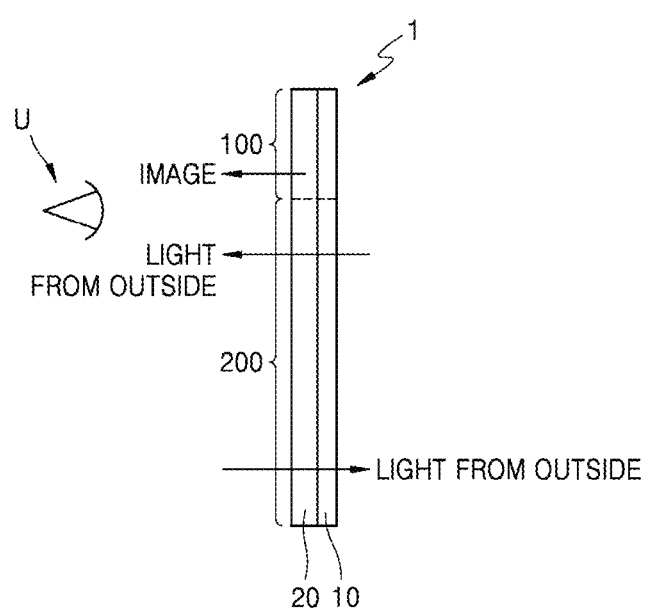
FIG. 1 is a side view schematically illustrating a display apparatus constructed according to the principles of the invention.

In the following description, for the purposes of explanation, numerous specific details are set forth in order to provide a thorough understanding of various illustrative embodiments or implementations of the invention. As used herein "embodiments" and "implementations" are interchangeable words that are non-limiting examples of devices or methods employing one or more of the inventive concepts disclosed herein. It is apparent, however, that various illustrative embodiments may be practiced without these specific details or with one or more equivalent arrangements. In other instances, well-known structures and devices are shown in block diagram form in order to avoid unnecessarily obscuring various illustrative embodiments. Further, various illustrative embodiments may be different, but do not have to be exclusive. For example, specific shapes, configurations, and characteristics of an illustrative embodiment may be used or implemented in another illustrative embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an illustrative embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the illustrative term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various illustrative embodiments are described herein with reference to sectional and/or exploded illustrations that are schematic illustrations of idealized illustrative embodiments and/or intermediate structures. As such, variations from the shapes of the illustrations as a result, for example, of manufacturing techniques and/or tolerances, are to be expected. Thus, illustrative embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a side view schematically illustrating a display apparatus constructed according to the principles of the invention.

Referring to FIG. 1, a display apparatus 1 includes a first substrate 10 and a display unit 20. The display unit 20 may include a display region 100 in which an image is displayed and a transmissive region 200 through which external light is transmitted. In the display apparatus 1, external light passes through the first substrate 10 and the display unit 20, and then, is incident.

The display unit 20 displays an image through a display region 100, and external light passes through the transmissive region 200. A user (U) may be able to see an external image through the transmissive region 200. For example, the light transmittance of the display region 100 may be different from the light transmittance of the transmissive region 200.

A top-emission type display apparatus in which a user U located on a side where an image is implemented can observe an external image of the first substrate 10 is described as an example. However, the display apparatus 1 is not limited thereto. In illustrative embodiments, the display apparatus 1 may be a bottom-emission type display apparatus in which an image is displayed in a direction of the first substrate 10 from the display unit 20.

By not disposing a thin-film transistor, a capacitor, or the like on the transmissive region 200, external light transmittance of the transmissive region 200 may be increased. As a result, the external light transmittance of the display apparatus 1 may be increased, and the occurrence of distortion of a transmitted image caused by interference with a thin-film transistor, a capacitor, or the like may be eliminated or reduced.

The display apparatus 1 may further include a second substrate 30 facing the first substrate 10. In this illustrative embodiment, the display unit 20 may be between the first substrate 10 and the second substrate 30 of FIG. 14.

The second substrate 30 may be formed as a transparent glass substrate or a plastic substrate, so as to enable implementation of an image from the display unit 20 and to prevent penetration of external air and moisture into the display unit 20. Edges of the first substrate 10 and the second substrate 30 may be combined with each other by a sealant so that the space between the first substrate 10 and the second substrate 30 may be also sealed. In the space, a moisture absorbent or a filler may be placed. In one illustrative embodiment, the display unit 20 may be sealed by forming the second substrate 30 which is a thin-film on both the first substrate 10 and the display unit 20. In this case, the first substrate 10 and the second substrate 30 may be both provided in a flexible form.

Hereinafter, an organic light-emitting display apparatus will be described as an example of the display apparatus 1. However, the illustrative embodiments of the invention are not limited thereto. For example, in one or more illustrative embodiments, various types of display apparatuses, such as an inorganic light-emitting display apparatus, a quantum-dot light-emitting display apparatus, or the like, may be used.

Figure 2:
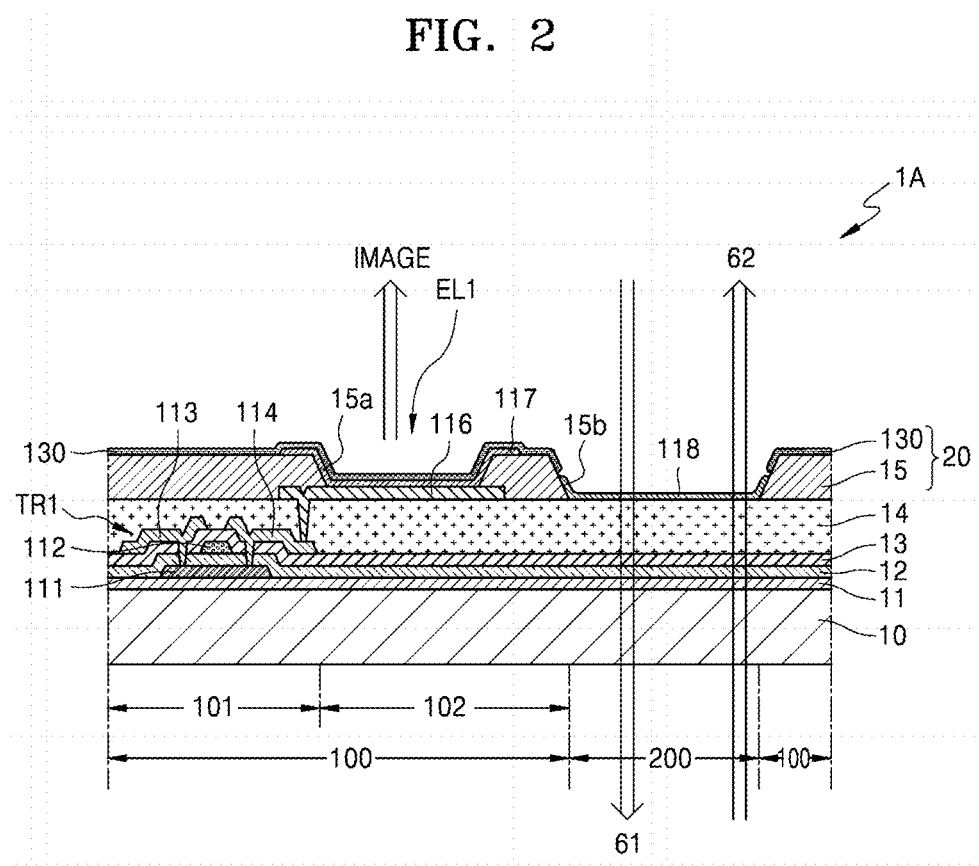
FIG. 2 is a cross-sectional view of an illustrative embodiment of a display apparatus constructed according to the principles of the invention.
Figure 3:
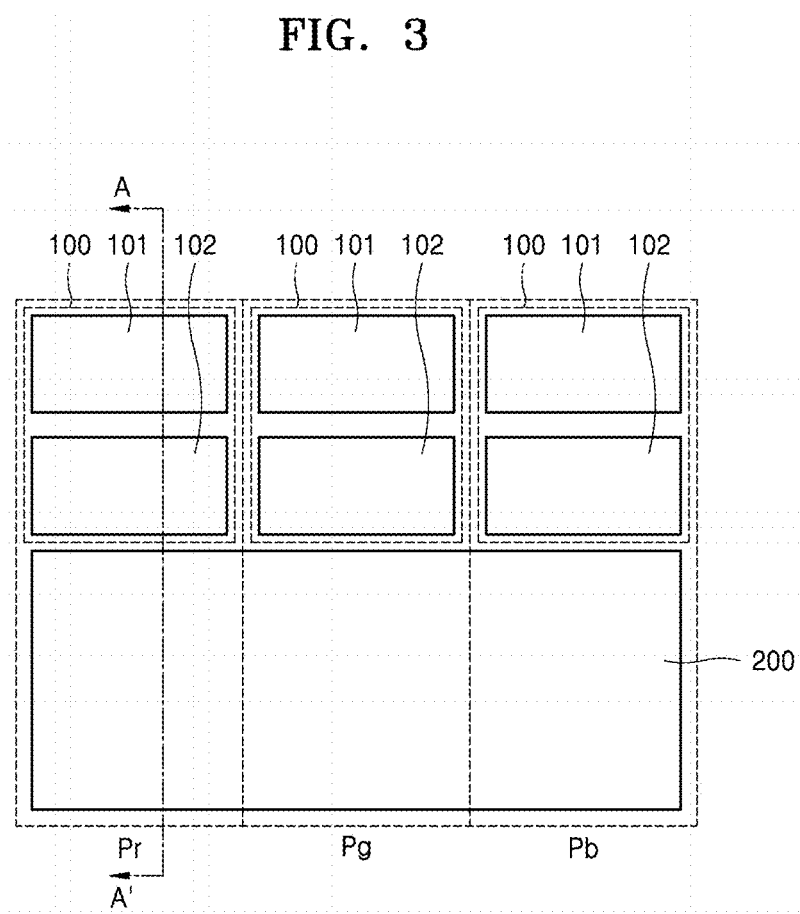
FIG. 3 is a plan view of the display apparatus of FIG. 2.

FIG. 2 is a cross-sectional view of an illustrative embodiment of a display apparatus constructed according to the principles of the invention and FIG. 3 is a plan view of the display apparatus of FIG. 2. In detail, FIG. 3 is a plan view illustrating first pixels (PX1s) including, for example, a first red pixel (Pr), a first green pixel (Pg), and a first blue pixel (Pb), and FIG. 2 is a cross-sectional view taken along with A-A' line in FIG. 3.

Referring to FIG. 0.2, a display unit 20 may include a display region 100 where image is displayed and a transmissive region 200 adjacent to the display region 100 through which external light is transmitted. Here, the external light is distinguished from light emitted by a light-emitting device EL1 of the first pixel PX1. The external light may be ambient light or light emitted by other electronic devices.

On the transmissive region 200, an opaque material is not disposed, and only a first transparent layer (e.g., an auxiliary layer), an insulating film, or the like may be substantially disposed. An image outside the display apparatus 1A may be transmitted as it is without substantial interference or distortion from the internal components of the display unit.

First external light 61 and second external light 62 may passes through the transmissive region 200. The first external light 61 may be the one transmitted in an outer direction of the first substrate 10 from the outside of the display unit 20. The second external light 62 may be the one transmitted in an outer direction of the display unit 20 from the outside of the first substrate 10. Devices and wirings may be detoured around the transmissive region 200, so that devices wires may not be arranged in the transmissive region 200. In the transmissive region 200, at least a fourth insulating film 15 may not be disposed. The third insulating film 14 disposed on the transmissive region 200 may include a transparent insulating material.

The display region 100 may include an emission region 102 and a circuit region 101. On the display region 100, the first pixel PX1 may be disposed. On the emission region 102, the light-emitting device EL1 of the first pixel PX1 may disposed. On the circuit region 101, a pixel circuit of the first pixel PX1 may be disposed, wherein the pixel circuit is electrically connected to the light-emitting device EL1 and includes a thin-film transistor (TR1). The circuit region 101 and the emission region 102 do not overlap, and therefore, the light-emitting device EL1 and the pixel circuit may be disposed adjacent to each other, so as not to overlap each other. As illustrated in the drawing, the circuit region 101 is not limited to the one in which one thin-film transistor TR1 is disposed. The circuit region 101 may include a plurality of thin-film transistors and capacitors, and may further include wirings, such as a scan line, a data line, a power line, and the like, connected to the plurality of the thin-film transistors and the capacitors.

The thin-film transistor TR1 may include a semiconductor layer 111 on a buffer film 11, a gate electrode 112, a source electrode 113, and a drain electrode 114. A first insulating film 12 between the semiconductor layer 111 and the gate electrode 112 may function as a gate insulating film, and a second insulating film 13 between the gate electrode 112 and the source electrode 113 and between the gate electrode 112 and the second insulating film 13 may function as an interlayer insulating film.

The light-emitting device EL1 may include a first electrode 116 on the third insulating film 14 covering the thin-film transistor TR1, a second electrode 130 facing the first electrode 116, and an intermediate layer 117 between the first electrode 116 and the second electrode 130. The second electrode 130 may work as a common electrode.

Both edges of the first electrode 116 may be covered by the fourth insulating film 15, and a central portion of the first electrode 116 may be exposed. The fourth insulating film 15 may be disposed to cover the display region 100, but does not necessarily cover the entire display region 100. Rather, the fourth insulating film 15 is disposed enough to cover at least a part of, particularly, edges of the first electrode 116 as shown in FIG. 2.

Referring to FIG. 2, a first layer (i.e., an auxiliary layer) 118 may be disposed on the third insulating film 14 corresponding to the transmissive region 200 which is exposed through the fourth insulating film 15. That is, the auxiliary layer 118 may be disposed, so as not to overlap the intermediate layer 117.

Here, the thickness of the auxiliary layer 118 may be in a range of about 1 nm to about 2,000 nm. In detail, the thickness of the auxiliary layer 118 may be in a range of about 1 nm to about 50 nm, but illustrative embodiments are not limited thereto. When the thickness is satisfied within the ranges above, a relatively high level of light transmittance of the transmissive region 200 may be achieved, while not adversely affecting patterning of the second electrode 130.

The auxiliary layer 118 may include a first material.

The second electrode 130 may be disposed on the intermediate layer 117. The second electrode 130 may be disposed only in an area corresponding with the display region 100, and may not be disposed on the transmissive region 200 as shown in FIG. 2.

The second electrode 130 may include a second material.

The first material and the second material may each satisfy Equation 1 below:

$$ST2-ST1>0 \text{ mJ/m}^2 \qquad \text{<Equation 1>}$$

In Equation 1,

ST1 is a surface energy of the first material at 25° C., and ST2 is a surface energy of the second material at 25° C.

The first material may be deposited in an area corresponding with the transmissive region 200 through a dry process, for example, a process using a fine metal mask. In one or more illustrative embodiments, the first material may be deposited in an area corresponding with the transmissive region 200 through a wet process. Next, the second material may be deposited on both the display region 100 and the transmissive region 200 by using an open mask. Here, by controlling the surface energies of the first material and the second material differently, the second material may be controlled not to be substantially deposited on an area where the first material is deposited. That is, the second material may be relatively well deposited on the intermediate layer 117 and/or the fourth insulating film 15, but may not be relatively well deposited on the auxiliary layer 118 including the first material as shown in FIG. 2 because the surface energy ST2 of the second material is greater than the surface energy ST1 of the first material. Therefore, when the auxiliary layer 118 including the first material is deposited in an area corresponding with the transmissive region 200, the second electrode 130 including the second material is not substantially disposed in the transmissive region 200, but rather may be disposed in an area corresponding with the display region 100 only. As shown in FIGS. 2 and 3, the auxiliary layer 118 is disposed on an area where the second electrode 130 should not be disposed, and the auxiliary layer 118 is not disposed on an area where the second electrode 130 should be disposed. In this regard, when disposing the second material, even through the second material is deposited on both the display region 100 and the transmissive region 200 of the all the pixels by using an open mask, the second material is substantially deposited on the exposed surface of the intermediate layer 117 and/or the fourth insulating film 15, and is not substantially deposited on the surface of the auxiliary layer 118 as shown in FIG. 2, thereby obtaining effects of patterning the second electrode 130.

To increase the transmittance rate of the transmissive region 200, the second electrode 130 should not be substantially disposed on the transmissive region 200. For this purpose, when fine metal mask is used to form the second electrode 130 disposed only on the display region 100, the deposition temperature is significantly high so that deformation may occur in the fine metal mask during long-term use. Accordingly, very unstable factors in process, such as a shadow phenomenon or the like, may occur. However, the display apparatus 1 may automatically obtain the patterning effect of the second electrode 130 as described above. Therefore, the display apparatus 1 may be advantageous in terms of the process.

In addition, since the second electrode 130 is not substantially disposed on the transmissive region 200, the transmittance of the transmissive region 200 may be improved. In other words, the second electrode 130 may be disposed only in an area corresponding with the display region 100, and due to absence of the second electrode 130 in the transmissive region 200, the transmittance of the transmissive region 200 may be improved.

For example, the difference between the surface energy ST2 of the second material and the surface energy ST1 of the first material, ST2-ST1 may be about 30 mJ/m$^2$ or more, and for example, may be about 50 mJ/m$^2$ or more. When ST2-ST1 is satisfied within the ranges above, the second material may not be substantially deposited on the first material because the surface energy ST2 of the second material is greater than the surface energy ST1 of the first material.

For example, ST1 may be greater than about 0 mJ/m$^2$ and 30 mJ/m$^2$ or less. When ST1 is satisfied within the range above, the second material may not be substantially deposited on the first material. In detail, ST1 may be 20 mJ/m$^2$ or less, but illustrative embodiments are not limited thereto.

In one illustrative embodiment, the first material may consist of an organic compound. In one or more illustrative embodiments, the first material may consist of an organic compound containing fluorine. In one or more illustrative embodiments, the first material may be an organic compound containing fluorine at a relatively amount.

For example, the first material may contain fluorine of 20 at % or more. When the amount of the fluorine is satisfied within the range above, the surface energy of the first material may be lowered so that the second material may not be substantially deposited on the first material. The amount of fluorine contained in the first material may be obtained by analyzing the first material using X-ray photoelectron spectroscopy (XPS). In detail, the first material may contain fluorine of 50 at % or more, but illustrative embodiments are not limited thereto.

For example, the first material may consist of, as described above, an organic compound, and the first material may include a fluorine-containing silane compound, a fluorine-based polymer compound, and a combination thereof.

Examples of the fluorine-containing silane compound include trichloro(1H,1H,2H,2H-perfluorodecyl)silane, trichloro(1H,1H,2H,2H-perfluoro-n-octyl)silane, triethoxy-1H,1H,2H,2H-perfluorodecylsilane, 1H,1H,2H,2H-nonafluorohexyltriethoxysilane, 1H,1H,2H,2H-tridecafluoro-n-octyltriethoxysilane, 1H,1H,2H,2H-heptadecafluorodecyltrimethoxysilane, 1H,1H,2H,2H-nonafluorohexyltrimethoxysilane, trimethoxy(1H,1H,2H,2H-perfluoro-n-octyl)silane, 1,1,1-trifluoro-3-(trimethoxysilyl)propane, triethylsilyl)trifluoromethane, triethoxy[5,5,6,6,7,7,7-heptafluoro-4,4-bis(trifluoromethyl) heptyl]silane, trichloro(3,3,3-trifluoropropyl)silane, dimethoxy(methyl)(3,3,3-trifluoropropyl)silane, and dichloro(methyl)(3,3,3-trifluoropropyl)silane, but illustrative embodiments are not limited thereto.

Examples of the fluorine-based compound include poly (hexafluoropropyleneoxide), poly(tetrafluoroethylene-co-hexafluoropropylene, poly(decafluorooctyl acrylate), poly (tetrafluoro-3-(heptafluoropropoxy)propyl acrylate), poly (tetrafluoro-3-(heptafluoroethoxy)propyl acrylate), poly (tetrafluoroehtylene), tetrafluoroethylene hexafluoropropylene vinylidene fluoride, poly(undecafluorohexyl acrylate), poly(nonafluoropentyl acrylate), poly(tetrafluoro-3-(trifluoromethoxy)propyl acrylate), poly(pentafluorovinyl propionate), poly(heptafluorobutyl acrylate), poly(trifluorovinyl acetate), poly(1,1,1,3,3,3-hexafluoroisopropyl acrylate), poly(octafluoropentyl acrylate), poly(m-ethyl 3,3,3-trifluoropropyl siloxane), poly(2,2,3,3,4,4,4-heptafluorobutyl methacrylate), poly(pentafluoropropyl acrylate), poly(2,2,3,3,3-pentafluoropropyl acrylate), poly (2-heptafluorobutoxy)ethyl acrylate), poly(chlorotrifluoroethylene), and poly(1,1,1,3,3,3-hexafluoroisopropyl methaacrylate), but illustrative embodiments are not limited thereto.

As the difference between ST2 and ST1 becomes larger, the second material may not be more likely substantially deposited on the first material. To enable this, ST2 may be greater than 30 mJ/m$^2$. In one illustrative embodiment, ST2 may be 100 mJ/m$^2$ or greater, but the illustrative embodiments are not limited thereto.

The second material may consist of an inorganic compound. In detail, the second material may consist of a metal-containing inorganic compound.

For example, the second material may include magnesium (Mg), silver (Ag), aluminum (Al), lithium (Li), calcium (Ca), indium (In), and a combination thereof. In detail, the second material may include Mg, Ag, Al, and a combination thereof.

The first pixel PX1 may be, for example, a first red pixel Pr, a first green pixel Pg, and a first blue pixel Pb. However, the illustrative embodiments are not limited thereto, and any combination of colors is possible as long as white light can be implemented through combination.

Figure 4:
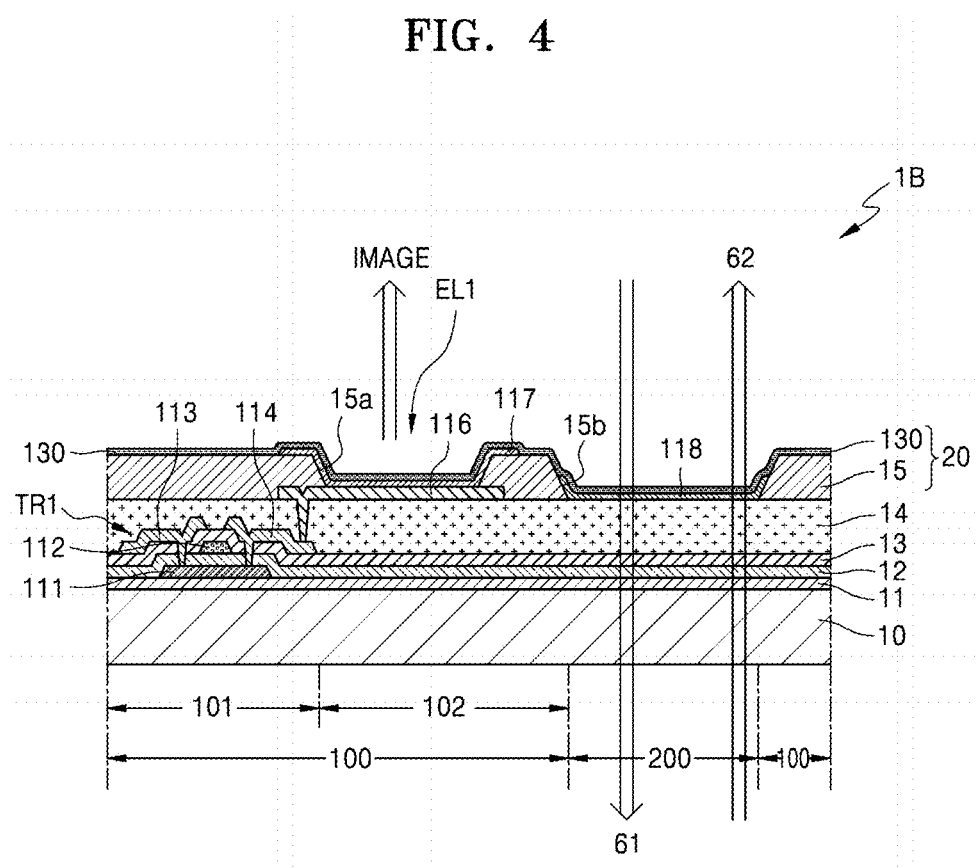
FIG. 4 is a cross-sectional view of another illustrative embodiment of a display apparatus constructed according to the principles of the invention.
Figure 5:
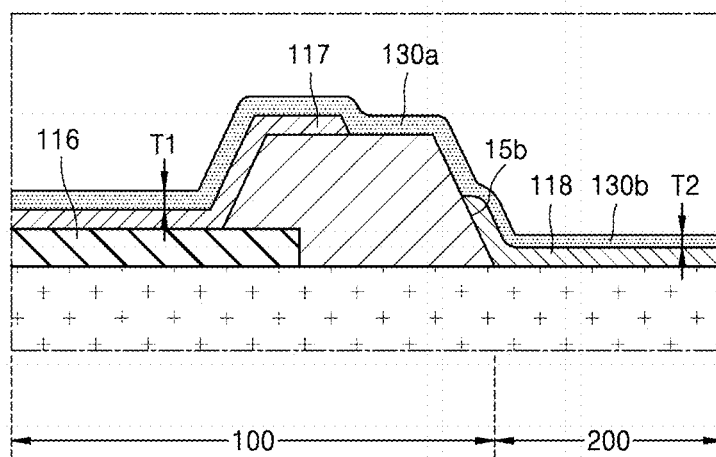
FIG. 5 is an enlarged cross-sectional view of the portion C of the display apparatus of FIG. 4.

FIG. 4 is a cross-sectional view of another illustrative embodiment of a display apparatus constructed according to the principles of the invention and FIG. 5 is an enlarged cross-sectional view of the display apparatus of FIG. 4.

The auxiliary layer 118 may be disposed on the transmissive region 200 only by using a fine metal mask used for patterning. In one or more illustrative embodiments, unlike the display apparatus in FIG. 2, the second electrode 130 may be disposed in an area corresponding with the display region 100 and at least a portion of the transmissive region 200. That is, the second electrode 130 may be disposed in an area corresponding with all or at least a portion of the transmissive region 200.

Hereinafter, an illustrative embodiment, in which the second electrode 130 is disposed in an area corresponding with the display region 100 and in all of the transmissive region 200, will be described in detail.

As shown in FIG. 5, when the second material is deposited with an open mask, a first portion 130a of the second electrode 130 may be disposed on the intermediate layer 117 in an area corresponding with the display region 100, and a second portion 130b of the second electrode 130 may be disposed on the auxiliary layer 118 in an area corresponding with the transmissive region 200. The thickness of the first portion 130a ($T_1$) and the thickness of the second portion 130b ($T_2$) each independently satisfy Equation 2 below:

$$T_1 > T_2. \qquad \text{<Equation 2>}$$

By satisfying Equation 2 above, a decrease in the transmittance due to the second portion 130b may be prevented.

Here, $T_1$ indicates an average value of thicknesses of the second electrode 130 in all first portions 130a, and $T_2$ indicates thicknesses of the second electrode 130 in all second portions 130b. Here, an area where the second material is deposited with an open mask includes all the first portions and all the second portions.

However, the description above does not exclude a case where the second electrode 130 is formed through agglomeration on a part of the transmissive region 200. That is, the second electrode 130 may be formed in an island form on the transmissive region 200.

In detail, $T_2$ may be greater than about 0 nm and about 1 nm or less. In further detail, $T_2$ may be greater than 0 nm and about 0.1 nm or less. When $T_2$ is satisfied within the range above, the second electrode 130 may be regarded as not being substantially disposed on the transmissive region 200.

Hereinafter, an illustrative embodiment, in which the second electrode 130 is disposed in an area corresponding with the display region 100 and at least a portion of the transmissive region 200, will be described in detail. That is, the second electrode 130 may not be disposed in an area corresponding with at least a portion of the transmissive region 200.

A portion of the second electrode 130 disposed in an area corresponding with the at least a portion of the transmissive region may include a plurality of particles including the second material.

In some illustrative embodiments, the thickness of the portion of the second electrode 130' disposed in an area corresponding with the display region 100 may be greater than an average diameter of the plurality of particles. In some illustrative embodiments, the ratio (R) of the thickness ($T_E$) of the portion of the second electrode 130 disposed in an area corresponding with the display region 100 to the average diameter ($D_M$) of the plurality of particles disposed in an area corresponding with the at least a portion of the transmissive region 200 may be 0.9 or less. In some illustrative embodiments, R may be 0.01 or greater, 0.1 or greater, 0.8 or less, 0.7 or less, 0.6 or less, or 0.5 or less, but illustrative embodiments are not limited thereto. When R is within any of these ranges, the display apparatus 1 may have a desired level of transmittance:

R={thickness ($T_E$) of the portion of the second electrode 130 disposed in an area corresponding with the display region 100}/{average diameter ($D_M$) of the plurality of particles disposed in an area corresponding with the at least a portion of the transmissive region 200}

For example, when $T_E$ is about 10 nm, $D_M$ may be about 5 nm or less, or for example, when $T_E$ is about 20 nm, $D_M$ may be about 10 nm or less.

Each component is the same as or similar in function to the corresponding component of the illustrative embodiments of FIGS. 2 and 3, and thus, a detailed description of each component will be omitted to avoid redundancy.

Figure 6:
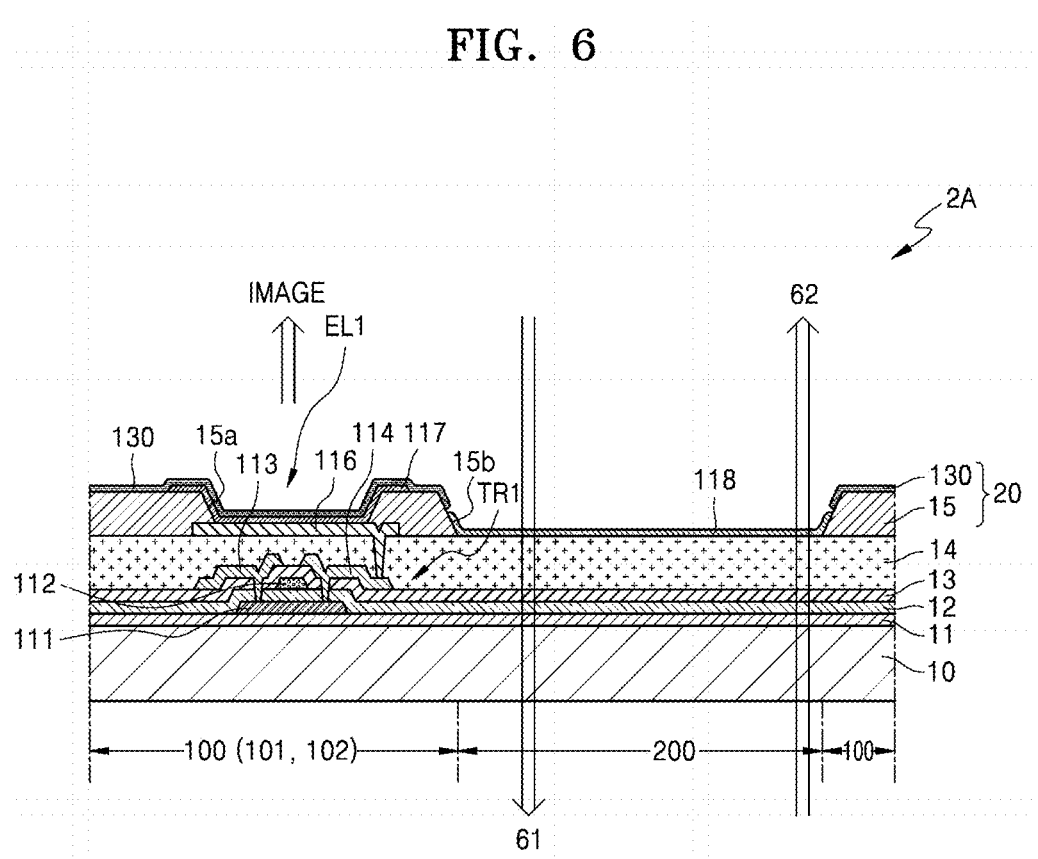
FIG. 6 is a cross-sectional view of still another illustrative embodiment of a display apparatus constructed according to the principles of the invention.
Figure 7:
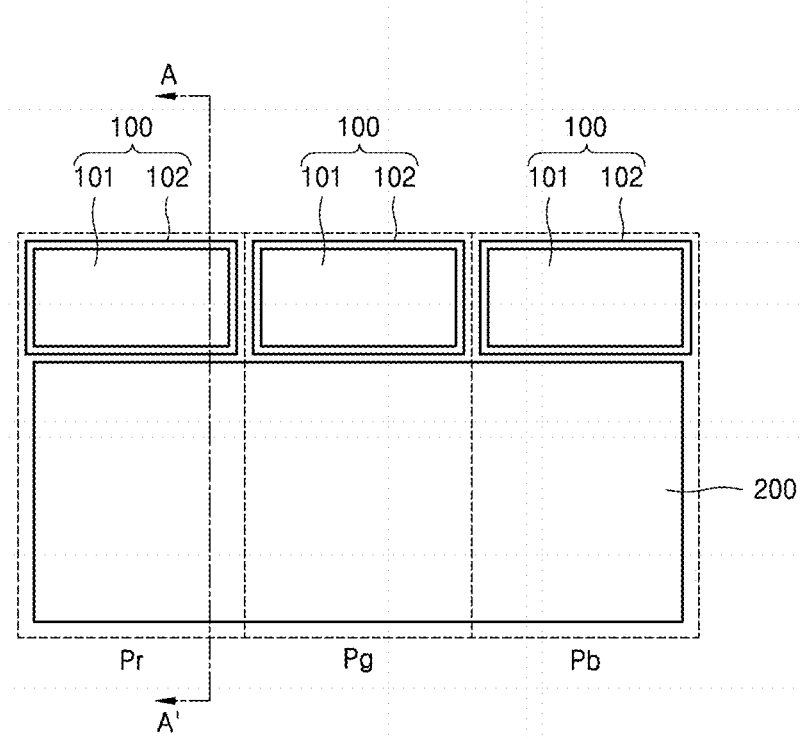
FIG. 7 is a plan view of the display apparatus of FIG. 6.

FIG. 6 is a cross-sectional view of still another illustrative embodiment of a display apparatus constructed according to the principles of the invention and FIG. 7 is a plan view of the display apparatus of FIG. 6. In detail, FIG. 7 is a plan view illustrating the first pixels PX1s adjacent to each other, such as first red pixels Prs, first green pixels Pgs, and first blue pixels Pbs, and FIG. 6 is a cross-sectional view taken along with A-A'; line in FIG. 6

Unlike the display apparatus 1A illustrated in FIGS. 2 and 3, in the display apparatus 2A illustrated in FIGS. 6 and 7, the circuit region 101 and the emission region 102 that are included in the display region 100 may be arranged so as to overlap each other on a plane.

In addition, adjacent transmissive regions of a plurality of the first pixels PX1, such as first red pixels Prs, first green pixels Pgs, and first blue pixels Pbs, may be connected to each other to form a common transmissive region 200. In this case, the resulting common transmissive region 200 may be wider than the transmissive region 200 of the illustrative embodiments of FIGS. 2 and 3. Accordingly, the display apparatus 2A may have increased transmittance.

Each component is the same as or similar in function to the corresponding component of the illustrative embodiments of FIGS. 2 and 3, and thus, a detailed description of each component will be omitted to avoid redundancy.

Figure 8:
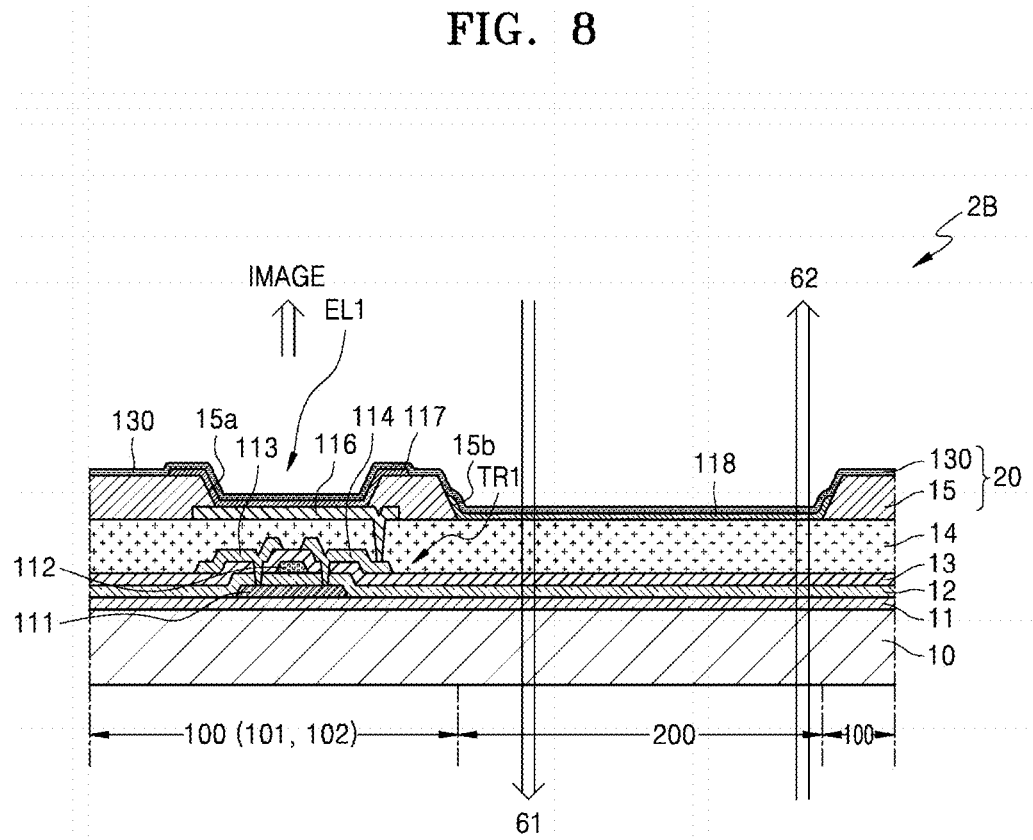
FIG. 8 is a cross-sectional view of still yet another illustrative embodiment of a display apparatus constructed according to the principles of the invention.

FIG. 8 is a cross-sectional view of still yet another illustrative embodiment of a display apparatus constructed according to the principles of the invention. That is, FIG. 8 is a cross-sectional view illustrating a display apparatus 2B according to another illustrative embodiment of the display apparatus 2A of FIG. 6.

The auxiliary layer 118 may be disposed on the transmissive region 200 only by using a fine metal mask used for patterning. In one or more illustrative embodiments, unlike the display apparatus in FIG. 6, the second electrode 130 may be disposed in an area corresponding with the display region 100 and at least a portion of the transmissive region 200. That is, the second electrode 130 may be disposed in an area corresponding with all or at least a portion of the transmissive region 200.

Hereinafter, an illustrative embodiment, in which the second electrode 130 is disposed in an area corresponding with the display region 100 and in all of the transmissive region 200, will be described in detail.

When the second material is deposited with an open mask, a first portion 130a of the second electrode 130 may be disposed on the intermediate layer 117 in an area corresponding with the display region 100, and a second portion 130b of FIG. 5 of the second electrode 130 may be disposed on the auxiliary layer 118 in an area corresponding with the transmissive region 200. The thickness of the first portion 130a of FIG. 5 is represented as a first thickness ($T_1$), and the thickness of the second portion 130b is represented as a second thickness ($T_2$), wherein $T_1$ and $T_2$ each independently satisfy Equation 2 below:

$$T_1 > T_2. \quad \text{<Equation 2>}$$

In Equation 2, $T_1$ indicates the thickness of the second electrode 130 on the display region 100; and $T_2$ indicates the thickness of the second electrode 130 on the transmissive region 200.

By satisfying Equation 2 above, a decrease in the transmittance due to the second portion 130b may be prevented.

In detail, $T_2$ may be greater than about 0 nm and about 1 nm or less. In further detail, $T_2$ may be greater than 0 nm and about 0.1 nm or less. When $T_2$ is satisfied within the range above, the second electrode 130 may not be substantially disposed on the transmissive region 200.

Hereinafter, an illustrative embodiment, in which the second electrode 130 is disposed in an area corresponding with the display region 100 and at least a portion of the transmissive region 200, will be described in detail. That is, the second electrode 130 may not be disposed in an area corresponding with at least a portion of the transmissive region 200.

A portion of the second electrode 130 disposed in an area corresponding with the at least a portion of the transmissive region may include a plurality of particles including the second material.

In some illustrative embodiments, the thickness of the portion of the second electrode 130 disposed in an area corresponding with the display region 100 may be greater than an average diameter of the plurality of particles. In some illustrative embodiments, the ratio (R) of the thickness ($T_E$) of the portion of the second electrode 130 disposed in an area corresponding with the display region 100 to the average diameter ($D_M$) of the plurality of particles disposed in an area corresponding with the at least a portion of the transmissive region 200 may be 0.9 or less. In some illustrative embodiments, R may be 0.01 or greater, 0.1 or greater, 0.8 or less, 0.7 or less, 0.6 or less, or 0.5 or less, but illustrative embodiments are not limited thereto. When R is within any of these ranges, the display apparatus 1 may have a desired level of transmittance:

R={thickness ($T_E$) of the portion of the second electrode 130 disposed in an area corresponding with the display region 100}/{average diameter ($D_M$) of the plurality of particles disposed in an area corresponding with the at least a portion of the transmissive region 200}

For example, when $T_E$ is 10 nm, $D_M$ may be about 5 nm or less, or for example, when $T_E$ is 20 nm, $D_M$ may be about 10 nm or less.

Each component is the same as or similar in function to the corresponding component of the illustrative embodiments of FIGS. 2 to 3, and thus, a detailed description of each component will be omitted to avoid redundancy.

FIGS. 9 to 14 are each a cross-sectional view of an illustrative method of manufacturing the display apparatus shown in FIGS. 2 and 3.

Referring to FIGS. 9 to 14, a method of preparing the display apparatus 1A includes the following steps: providing a first substrate and providing a display unit on the first substrate, wherein the display unit includes a display region and a transmissive region, wherein the providing of the display unit includes: providing an auxiliary layer on the transmissive region only; and providing a second electrode on the display region or on both the display region and the transmissive region, the auxiliary layer includes a first material, and the second electrode includes a second material, wherein descriptions of the first material and the second material are substantially the same as described above.

Hereinafter, the method of preparing the display apparatus 1A according to an illustrative embodiment will be described in detail with reference to the drawings.

Figure 9:
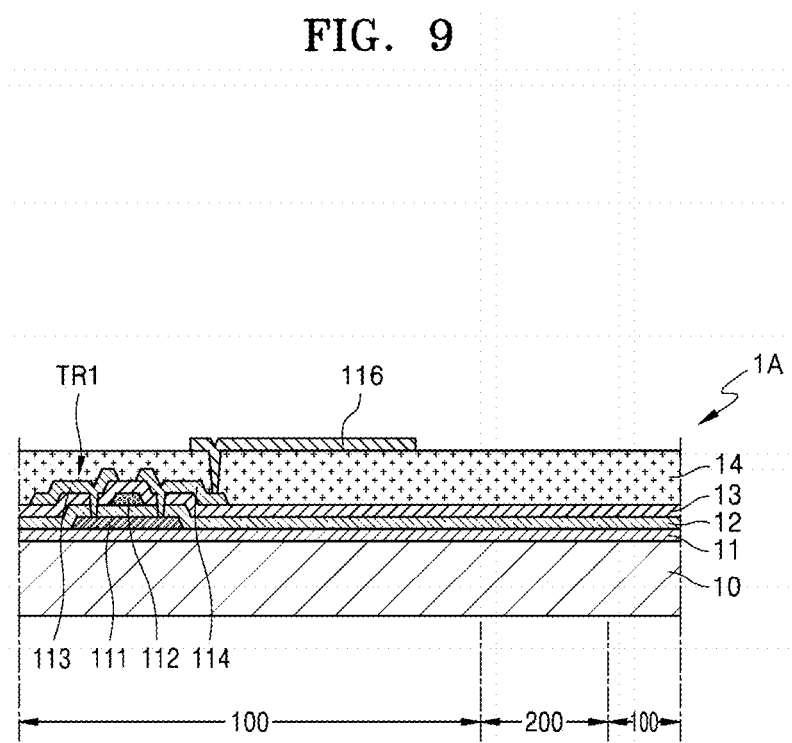
FIGS. 9 to 14 are each a cross-sectional view of an illustrative method of manufacturing the display apparatus shown in FIGS. 2 and 3.

Referring to FIG. 9, the buffer film 11 is disposed on the first substrate 10, and the pixel circuit including the thin-film transistor TR1 is provided on the buffer film 11.

The first substrate 10 may include a glass material, a ceramic material, a metal material, a plastic material, or a material having flexible or bendable properties.

The buffer film 11 prevents penetration of impurity elements through the first substrate 10, functions to planarize the surface, and is formed of an inorganic material, such as silicon nitride ($SiN_x$) and/or silicon oxide ($SiO_x$), in a single layer or multiple layers. Use of the buffer film 11 may be omitted.

On the buffer film 11, the semiconductor layer 111 of the first pixel PX1 of the display apparatus 1A may be disposed. The semiconductor layer 111 may include a variety of materials. For example, the semiconductor layer 111 may include an inorganic semiconductor material, such as amorphous silicon or crystalline silicon. In one or more illustrative embodiments, the semiconductor layer 111 may include an oxide semiconductor or an organic semiconductor material.

The first insulating film 12 may be disposed on the buffer film 11 so as to cover the semiconductor layer 111, and the gate electrode of the first pixel PX1 may be provided on the first insulating film 12.

The first insulating film 12 may be formed of at least one selected from $SiO_2$, $SiN_x$, SiON, $Al_2O_3$, $TiO_2$, $Ta_2O_5$, $HfO_2$, $ZrO_2$, BST, and PZT, in a single layer or multiple layers. The first insulating film 12 may be an inorganic insulating film.

The gate electrode 112 may be formed of various conductive materials. For example, the gate electrode 112 may be formed of at least one selected from aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper Cu), in a single layer or multiple layers. For example, the gate electrode 112 may be formed in a three-layered structure of Mo/Al/Mo or Ti/Al/Ti.

The second insulating film 13 may be disposed on the first insulating film 12 to cover the gate electrode 112. The source electrode 113 and the drain electrode 114 of the first pixel PX1 may be provided on the second insulating film 13 so that each of the source electrode 113 and the drain electrode 114 may be electrically connected to the semiconductor layer 111 through a contact hole.

The second insulating film 13 may be an inorganic insulating film. The second insulating film 13 may be formed of at least one selected from $SiO_2$, $SiN_x$, SiON, $Al_2O_3$, $TiO_2$, $Ta_2O_5$, $HfO_2$, $ZrO_2$, BST, and PZT, in a single layer or multiple layers. In one or more illustrative embodiments, the second insulating film 13 may be an organic insulating film.

The source electrode 113 and the drain electrode 114 may be formed of various conductive materials. For example, the source electrode 113 and the drain electrode 114 may be formed of at least one selected from aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu), in a single layer or multiple layers. For example, the source electrode 113 and the drain electrode 114 may be formed in two or more layers.

The structure of the thin-film transistor TR1 is not limited to the structure illustrated herein, and various structures of thin-film transistors may be applied.

The third insulating film 14 may be disposed so as to cover the thin-film transistor TR1 of the first pixel PX1.

The third insulating film 14 may be formed of an organic insulating film having a planarized top surface, in a single layer or multiple layers. The third insulating film 14 may include a general-purpose polymer (e.g., PMMA, PS, or the like), a polymer derivative including a phenol group, an acryl-based polymer, an imide-based polymer, an arylether-based polymer, an amide-based polymer, a fluorine-based polymer, a p-xylene-based polymer, a vinyl alcohol-based polymer, and a blend thereof. For example, the third insulating film 14 may include polyimide, polyamide, acryl resin, and the like.

In general, the surface energy of a compound included in the third insulating film 14 is 100 mJ/m$^2$ or more. Therefore, assuming the surface energy ST2 of the second material is about 100 mJ/m$^2$, when the second material is directly deposited on both the display region 100 and the transmissive region 200 by using an open mask without forming the auxiliary layer 118 on the transmissive region 200, the surface energy of a compound included in the third insulating film 14 may be equal to or similar with a surface energy of the second material. Accordingly, the patterning the second electrode 130 with the second material may not occur at all.

On the third insulating film 14, the first electrode 116 of the light-emitting device EL1 that is electrically connected to the thin-film transistor TR1 of the first pixel PX1 may be provided. The first electrode 116 may be provided in an area corresponding with the display region 100.

When the light-emitting device EL1 is a top-emission type light-emitting device, the first electrode 116 may be formed as a reflective electrode. Such a reflective electrode may include a reflective layer including Ag, Mg, Al, Pt, Pd, Au, Ni, Nd, Ir, Cr, and a compound thereof, and a transparent or semi-transparent electrode layer on the reflective layer. When the light-emitting device EL1 is a bottom-emission type light-emitting device, the first electrode 116 may include a transparent material, such as ITO, IZO, ZnO, or In$_2$O$_3$, and may be formed as a transparent or semi-transparent electrode.

As illustrated in FIG. 9, the buffer film 11, the first insulating film 12, the second insulating film 13, and the third insulating film 14 may each be disposed to cover both the display region 100 and the transmissive region 200. However, illustrative embodiments are not limited thereto, and at least one selected from the buffer film 11, the first insulating film 12, the second insulating film 13, and the third insulating film 14 may include an opening (not shown) located at a position corresponding to the transmissive region 200, thereby increasing the transmittance of external light of the transmissive region 200.

The external light passes through the transmissive region 200, and then, is recognized by a user. Therefore, only a transparent insulating film or the like may be disposed on the transmissive region 200. In addition, the transmittance of the transmissive region 200 may be increased by minimizing reflections generated at the interface of the films disposed on the transmissive region 200.

The reflections generated at the interface of the films may become larger as the difference in the refractive indices between the films contacting each other becomes larger. In one illustrative embodiment, the buffer film 11, the first insulating film 12, the second insulating film 13, and the third insulating film 14 may all be a single film having substantially the same refractive index. When the refractive indexes of the buffer film 11, the first insulating film 12, the second insulating film 13, and the third insulating film 14 disposed on the transmissive region 200 are all constituted same, the transmittance of the transmissive region 200 may be increased by minimizing the reflections generated at the interface of the films.

Figure 10:
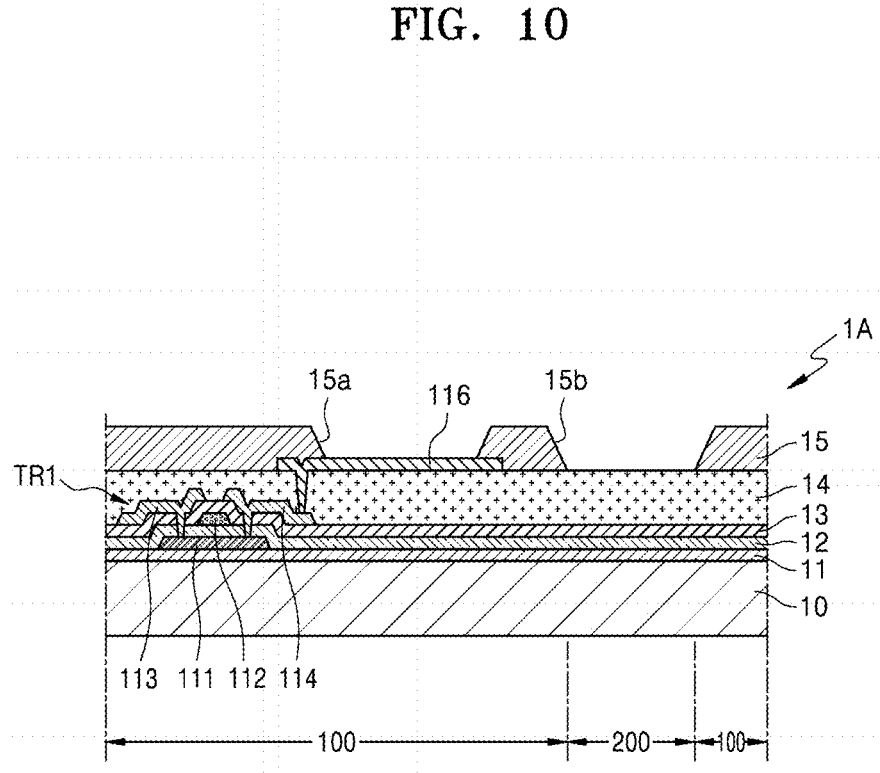

Referring to FIG. 10, a fourth insulating film 15 covering edges of the first electrode 116 may be provided on the third insulating film 14. The fourth insulating film 15 may be the above-described inorganic insulating film or an organic insulating film, each formed in a single layer or multiple layers.

The fourth insulating film 15 may be disposed to cover the display region 100 of the display apparatus 1A, and does not necessarily cover the entire display region 100. Rather, it is enough for the fourth insulating film 15 to cover at least a part of, particularly, edges of the first electrode 116 of the first pixel PX1 as shown in FIG. 10.

The fourth insulating film 15 may be disposed with a first opening 15a exposing at least a portion of the first electrode 115 of the first pixel PX1 and a second opening 15b located at a position corresponding to the transmissive region 200. Since the fourth insulating film 15 is not located on the transmissive region 200, the transmittance efficiency of external light of the transmissive region 200 may be further increased.

Figure 11:
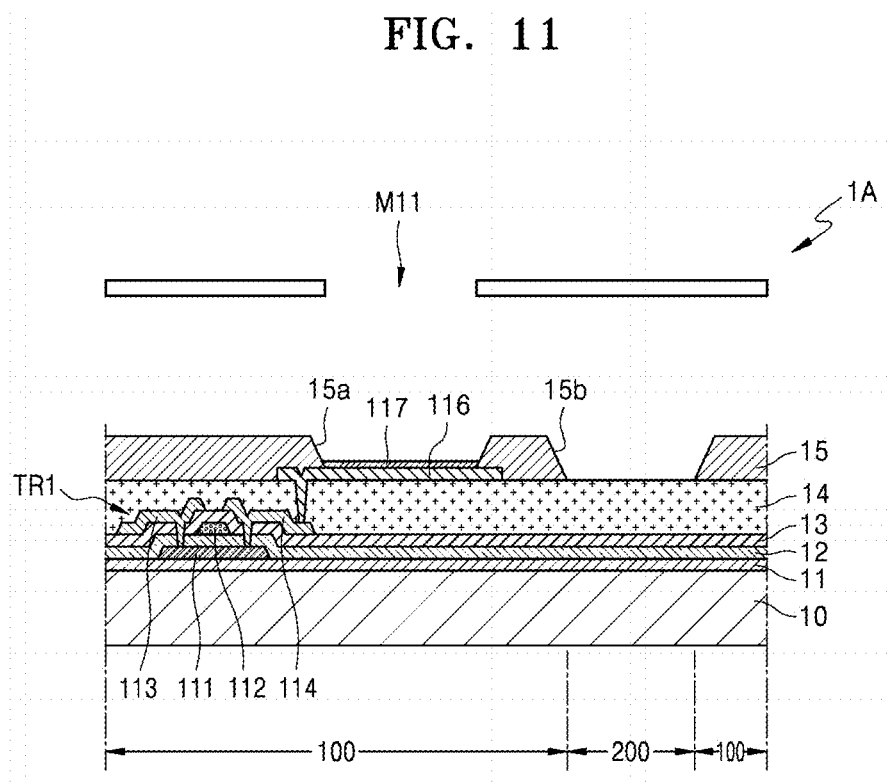

Referring to FIG. 11, the intermediate layer 117 may be disposed on the first electrode 116 exposed through the first opening 15a of the first pixel PX1.

The intermediate layer 117 may include an emission layer configure to emit light, and may further include at least one functional layer selected from a hole injection layer (HIL), a hole transport layer (HTL), an electron transport layer (ETL), and an electron injection layer (EIL). However, illustrative embodiments are not limited thereto, and various functional layers may be further disposed on the first electrode 116.

The emission layer may be a red emission layer, a green emission layer, or a blue emission layer. In one or more illustrative embodiments, the emission layer may have a multi-layered structure in which a red emission layer, a green emission layer, and a blue emission layer are stacked, so as to emit white light, or may have a single-layered structure including a red light-emitting material, a green light-emitting material, and a blue light-emitting material.

In one illustrative embodiment, the intermediate layer 117 may be disposed on the emission region 102 only by using a mask having an opening M11, for example, a fine metal mask (FMM), corresponding to the emission region 102 of the display apparatus 1A.

In one or more illustrative embodiments, the emission layer in the intermediate layer 117 may be disposed on the emission region 102 only by using an FMM having an opening M11 corresponding to the emission region 102 of the display apparatus 1A, and other functional layers may be disposed on the front surface of the first substrate 10 by using an open mask.

In one illustrative embodiment, at least the emission layer is not disposed on the transmissive region 200 of the display apparatus 1A.

Figure 12:
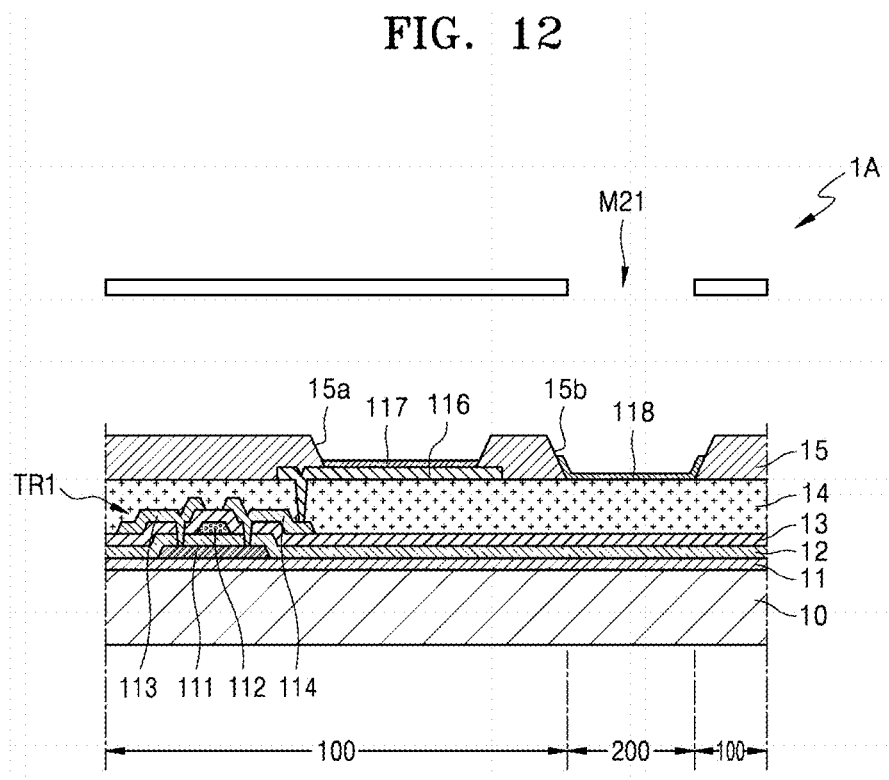

Referring to FIG. 12, the auxiliary layer 118 may be disposed on the third insulating film 14 which is exposed through the second opening 15b.

In one illustrative embodiment, the auxiliary layer 118 may be disposed on the transmissive region 200 only by a dry process, for example, a process using an FMM having an opening M21 corresponding to the transmissive region 200.

In one or more illustrative embodiments, the auxiliary layer 118 may be coated on the transmissive region 200 only by using a wet process.

Figure 13:
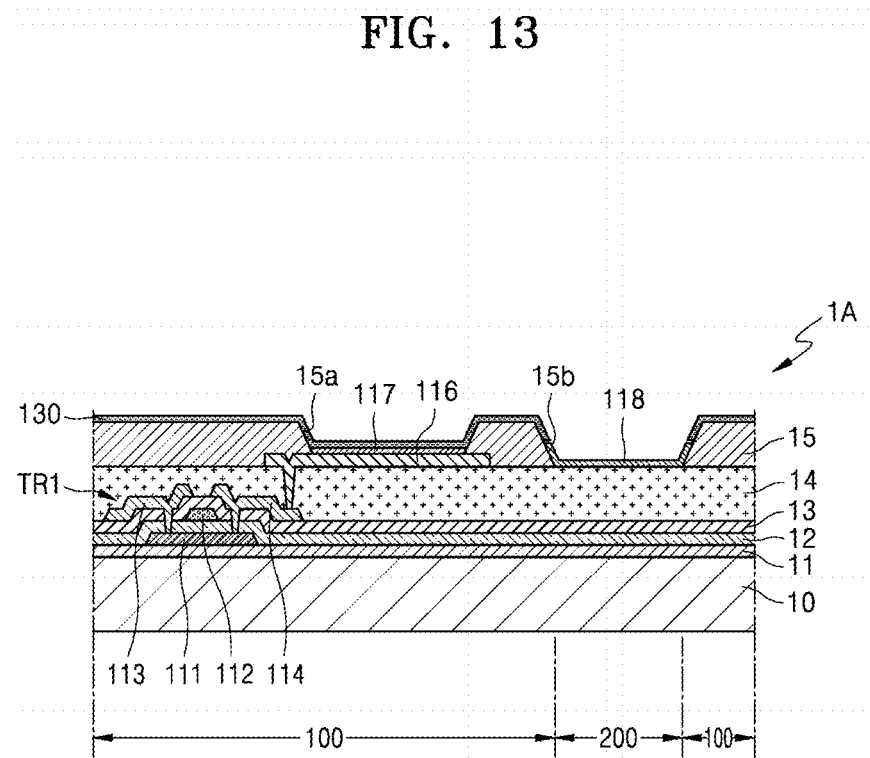

Referring to FIG. 13, in one illustrative embodiment, the second electrode 130 may be disposed on the intermediate layer 117 or on both the intermediate layer 117 and the auxiliary layer 118.

The second electrode 130 may be disposed by depositing the second material using an open mask. Here, the surface energies of the first material of the auxiliary layer 118 and the second material of the second electrode 130 are controlled differently so that the second material may not be substantially disposed on the transmissive region 200 to which the first material is disposed. That is, the second material may be well deposited on the intermediate layer 117, but may not be well deposited on the auxiliary layer 118 including the first material. Therefore, as the auxiliary layer 118 including the first material is disposed in an area corresponding with the transmissive region 200, the second electrode 130 including the second material may not be substantially disposed on the transmissive region 200, but may be disposed in an area corresponding with the display region 100 only.

Figure 14:
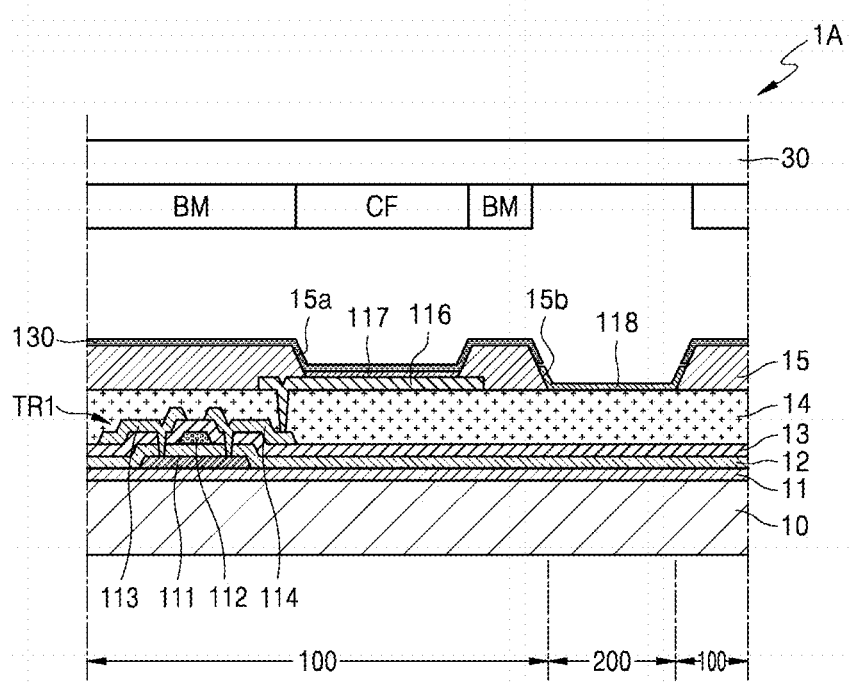

Referring to FIG. 14, after the second substrate 30 is additionally aligned on the first substrate 10, the first substrate 10 and the second substrate 30 may be coupled.

The second substrate 30 may include a glass material, a ceramic material, a metal material, a plastic material, or a material having flexible or bendable properties.

On a surface facing the first substrate 10 of the second substrate 30, a black matrix (BM) and a color filter (CF) may be disposed. The CF may be disposed in an area corresponding with the emission region 102 of the display apparatus 1A. The BM may be disposed in an area corresponding with an area excluding the emission region 102 and the transmissive region 200 of the display apparatus 1A. That is, the BM is not disposed on the transmissive region 200 of the display apparatus 1A.

An auxiliary layer may be further disposed on the second electrode 130 before the second substrate 30 is coupled to the first substrate 10. The auxiliary layer may be a single layer or multiple layers of an inorganic film and/or an organic film.

In addition, various functional layers may be further disposed on the second substrate 30. For example, a functional layer may be an anti-reflection layer that minimizes reflection of the front surface of the second substrate 30, a contamination-preventive layer to prevent contamination such as hand marks (e.g., fingerprints)

In one or more illustrative embodiments, a thin-film encapsulation layer, instead of the second substrate 30 described above, may be disposed on the first substrate 10 The thin-film encapsulation layer may include an inorganic encapsulation layer consisting of at least one inorganic material and an organic encapsulation layer consisting of at least one organic material. In one illustrative embodiment, the thin-film encapsulation layer may be disposed as a stacked structure of first inorganic encapsulation layer/ organic encapsulation layer/second inorganic encapsulation layer.

Figure 15:
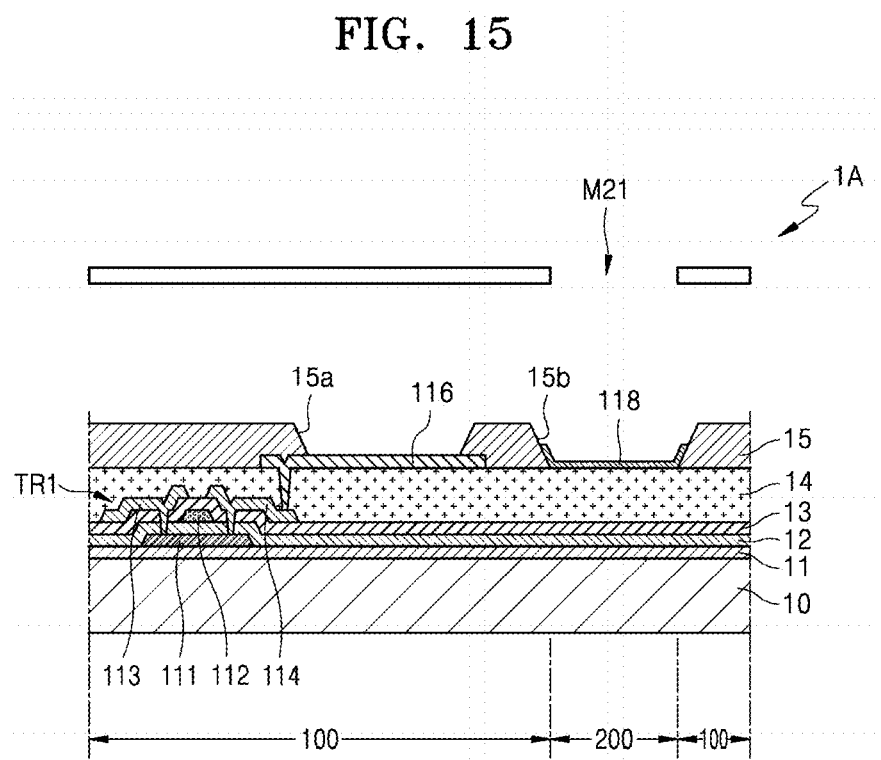
FIGS. 15 and 16 are each a cross-sectional view of another illustrative a method of manufacturing the display apparatus shown in FIGS. 2 and 3.
Figure 16:
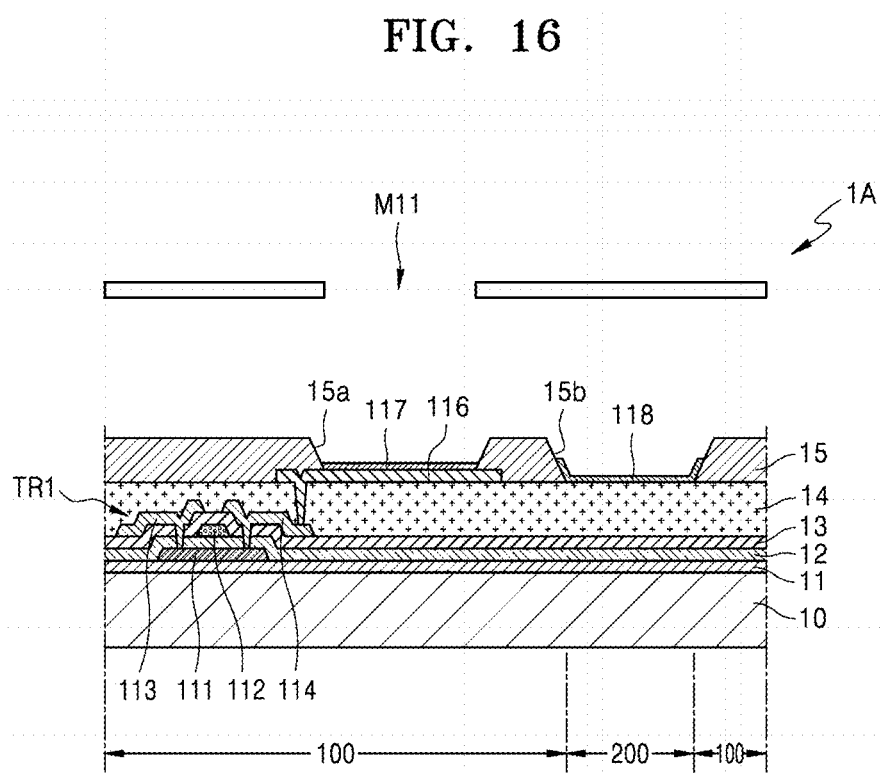

FIGS. 15 and 16 are each a cross-sectional view of another illustrative method of manufacturing the display apparatus shown in FIGS. 2 and 3.

In another illustrative embodiment, after the process shown in FIG. 10, a process shown in FIG. 15 and a process shown in FIG. 16 are subsequently performed. Then, as illustrated in FIG. 13, on the intermediate layer 117 and the auxiliary layer 118, the second electrode 130 may be disposed as a common electrode over the front surface of the first substrate 10. In other words, the auxiliary layer 118 may be disposed before the intermediate layer 117 is disposed unlike the illustrative embodiments shown in FIGS. 11 and 12. In detail, after the process illustrated in FIG. 10, as shown in FIG. 15, the auxiliary layer 118 may be disposed on the third insulating film 14 which is exposed through the second opening 15b. Next, as shown in FIG. 16, the intermediate layer 117 may be disposed on the first electrode 116 which is exposed through the first opening 15a of the first pixel PX1.

As long as the second electrode 130 is formed after the auxiliary layer 118 is formed, various modifications in the process are possible.

The display apparatus 1 may be implemented as an electronic device 1000, such a mobile phone, a video phone, a smart phone, a smart pad, a smart watch, a tablet PC, a laptop, a computer monitor, a television, a digital broadcast terminal, a personal digital assistant (PDA), a portable multimedia player (PMP), a head mounted display (HMD), a car navigation, and the like.

Figure 17:
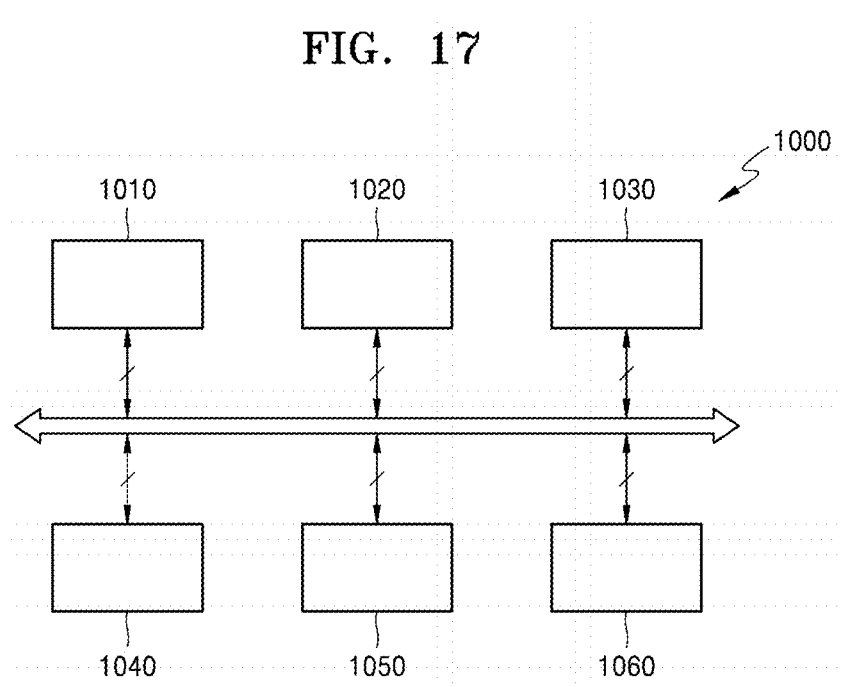
FIG. 17 is a block diagram schematically illustrating a configuration of an electronic device constructed according to the principles of the invention.
Figure 18A:
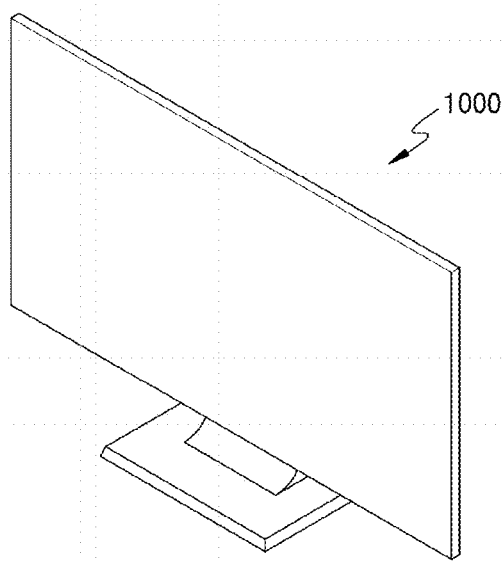
FIGS. 18A and 18B are each a perspective view of illustrative embodiments of an electronic device constructed according to the principles of the invention.
Figure 18B:
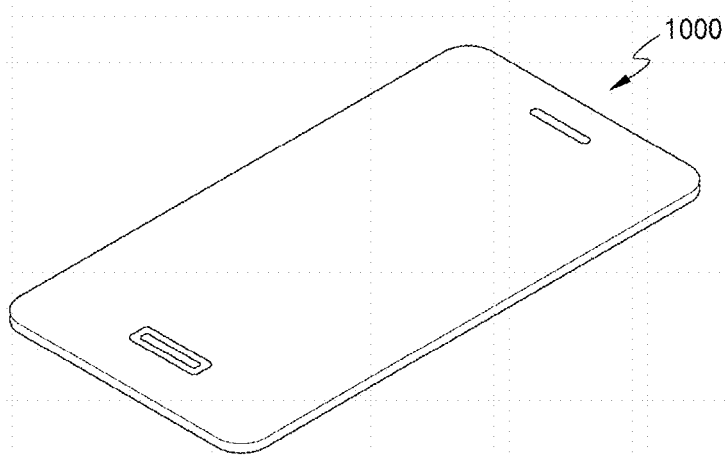

FIG. 17 is a block diagram schematically illustrating a configuration of an electronic device constructed according to the principles of the invention. FIGS. 18A and 18B are each a perspective view of illustrative embodiments of an electronic device constructed according to the principles of the invention.

Referring to FIG. 0.17, the electronic device 1000 may include a processor 1010, a memory 1020, a storage 1030, an input/output device 1040, a power supply 1050, and a display 1060. Here, the display 1060 may correspond to the display apparatus 1 of FIG. 1. The electronic device 1000 may communicate with a video card, a sound card, a memory card, a USB device, or the like, or may further include various ports that can communicate with other systems.

In one illustrative embodiment, as shown in FIG. 18A, the electronic device 1000 may be implemented as a television. In one or more illustrative embodiments, as shown in FIG. 18A, the electronic device 1000 may be implemented as a smart phone. However, illustrative embodiments are not limited thereto.

Figure 19:
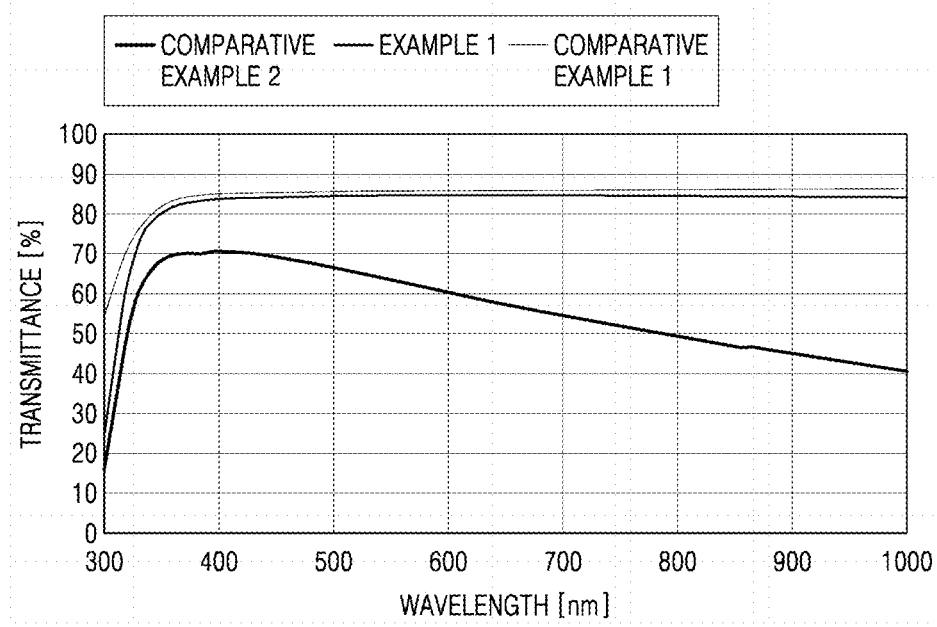
FIG. 19 is a graph showing wavelength-dependent transmittance in Example 1 and Comparative Examples 1 and 2.

Next, referring to FIGS. 19 and 20, the formation of the second electrode 130 according to the presence or absence of the auxiliary layer 118 will be described. FIG. 19 is a graph showing wavelength-dependent transmittance in Example 1 and Comparative Examples 1 and 2. The transmittance of each of Comparative Examples 1 to 3 and Examples 1 and 2 was measured at a wavelength in a range of 300 nm to 1,000 nm.

Referring to FIG. 19, the graph indicated in Comparative Example 1 is a graph of the transmittance of Sample 1. Sample 1 is a glass substrate having a thickness of 0.5 mm. The graph indicated in Comparative Example 2 is a graph of the transmittance of Sample 2. Sample 2 is a substrate on which an AgMg thin-film having a thickness of 9 nm is formed by depositing AgMg (weight ratio=10:1) on a glass substrate having a thickness of 0.5 mm. The graph indicated in Example 1 is a graph of the transmittance of Sample 3.

Sample 3 is a substrate prepared by forming an auxiliary layer (e.g., the auxiliary layer 118 of FIG. 2) on a glass substrate to a thickness of 10 nm and depositing AgMg on the auxiliary layer. The closer to the transmittance graph of Comparative Example 1 means that the second electrode was not formed.

As shown in FIG. 19, it was confirmed that the graph of Example 1 was significantly closer to the graph of Comparative Example 1 as compared with the graph of Comparative Example 2. Accordingly, it was confirmed that the second electrode was not substantially formed by forming the auxiliary layer.

Figure 20:
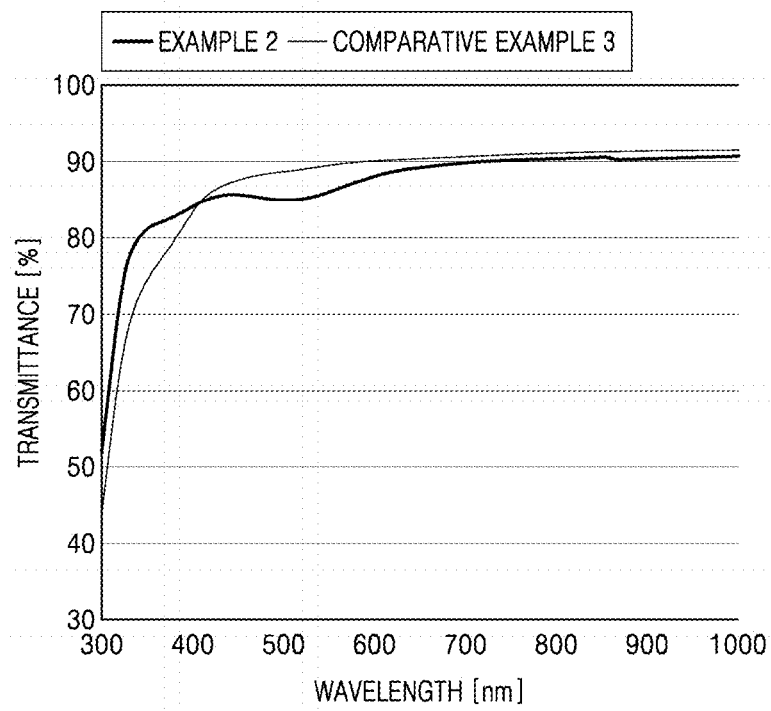
FIG. 20 is a graph showing wavelength-dependent transmittance in Example 2 and Comparative Example 3.

FIG. 20 is a graph showing wavelength-dependent transmittance in Example 2 and Comparative Example 3. Referring to FIG. 20, the graph shown as Comparative Example 3 is a transmittance graph of Sample 4. Sample 4 is a substrate prepared by forming a mixed electron transport layer having a thickness of 36 nm on a glass substrate having a thickness of 0.5 mm and then an Yb thin film having a thickness of 1.3 nm. The graph shown as Example 2 is a transmittance graph of Sample 5. Sample 5 is a substrate prepared by forming a mixed electron transport layer having a thickness of 36 nm on a glass substrate having a thickness of 0.5 mm, an auxiliary layer (e.g., the auxiliary layer 118 of FIG. 2) having a thickness of 10 nm, and an Yb thin film having a thickness of 1.3 nm, and then depositing AgMg (at a weight ratio=10:1). The closer to the transmittance graph of Comparative Example 3 means that the second electrode was not formed.

As shown in FIG. 20, it was confirmed that the graph of Example 2 was significantly closer to the graph of Comparative Example 3. Accordingly, it was confirmed that the second electrode was not substantially formed by forming the auxiliary layer. In addition, the average transmittance of Example 2 was 87.15%, which is very similar with the average transmittance of Comparative Example 3, that is, 87.45%.

Figure 21A:
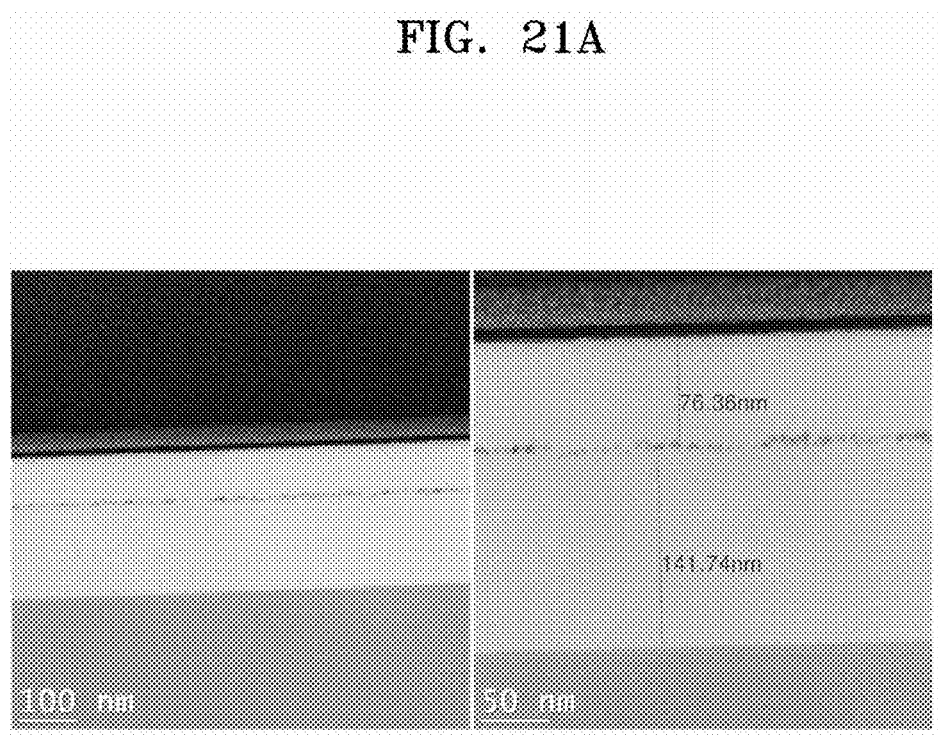
FIG. 21A is a transmission electron microscope (TEM) image of Example 2.
Figure 21B:
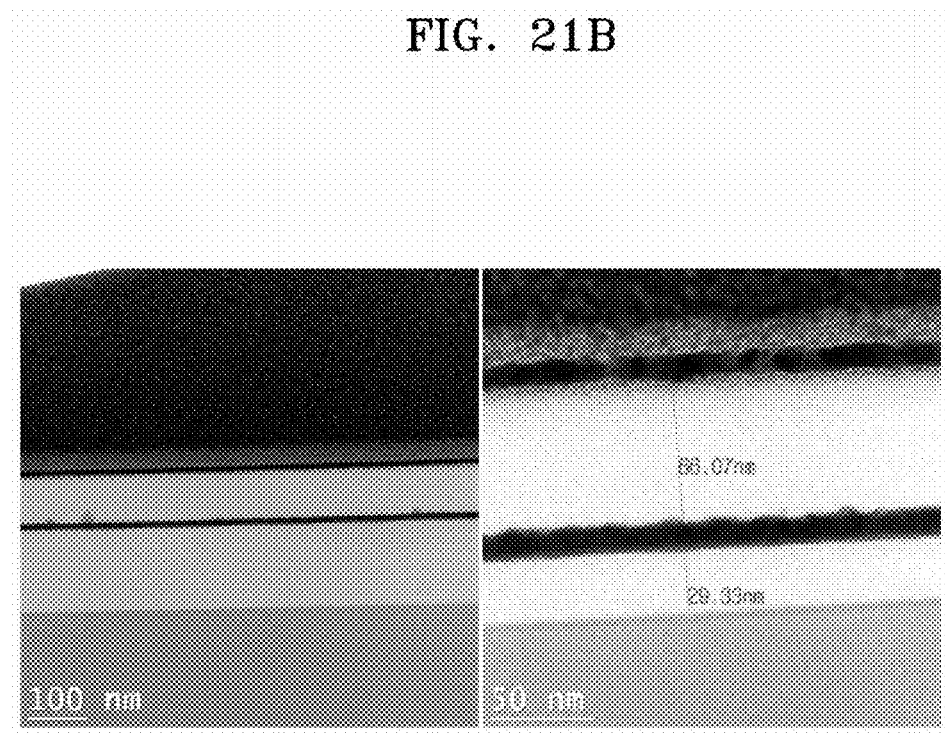
FIG. 21B is a TEM image of Comparative Example 3.
Figure 21C:
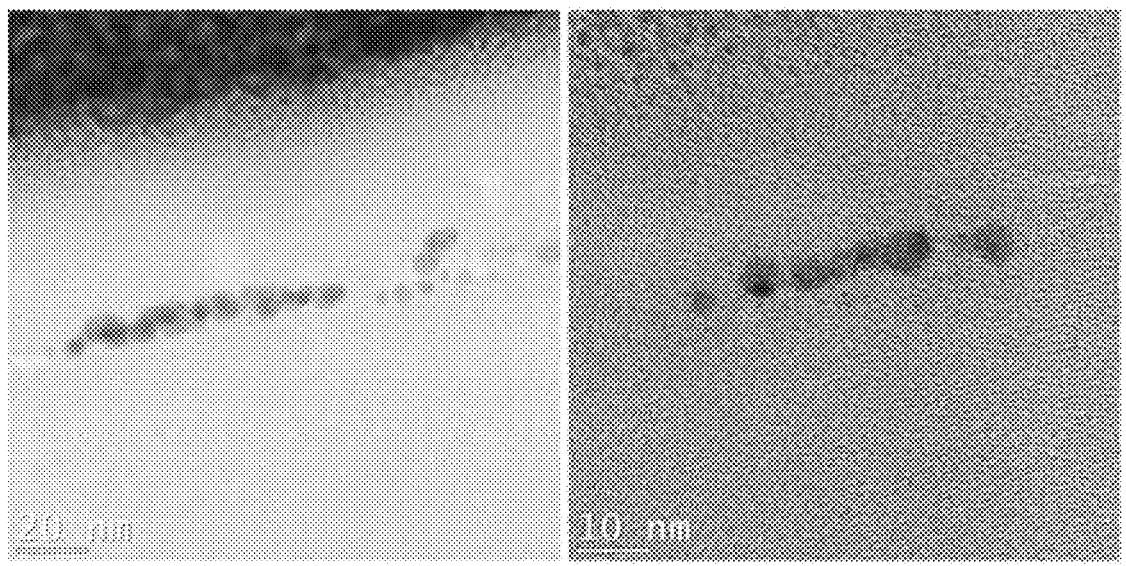
FIG. 21C is a partial enlarged view of FIG. 21A.

FIG. 21A is a transmission electron microscope (TEM) image of Example 2, FIG. 21B is a TEM image of Comparative Example 3, and FIG. 21C is a partial enlarged view of FIG. 21A. Specifically, referring to FIG. 21A, the second electrode formed on the auxiliary layer in Example 2 was found to have a particle shape.

According to various illustrative embodiments, it is possible to provide a display apparatus having relatively high transmittance and a method of preparing the display apparatus, when no second electrode (e.g., common electrode) is substantially formed on a transmissive region, which means that the second electrode is not formed at all or has a thickness that is so small.

Although certain illustrative embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display apparatus comprising: a first substrate and a display unit,
wherein the display unit comprises a display region and a transmissive region, with an insulating layer disposed on the display region and the transmissive region, a first opening in the insulating layer overlapping the display region and a second opening in the insulating layer distinct from the first opening overlapping the transmissive region,
the display unit further comprises: an auxiliary layer disposed in the second opening overlapping the transmissive region; and a second electrode disposed in the first opening overlapping the display region and above the auxiliary layer in at least a portion of the transmissive region,
the auxiliary layer comprises a first material,
the second electrode comprises a second material,
the first material comprises about 20 at % or more of fluorine, and
the first material and the second material each satisfy Equation 1 below:

$$ST2 - ST1 > 0 \text{ mJ/m}^2 \qquad \text{<Equation 1>}$$

wherein, in Equation 1,
ST1 is a surface energy of the first material at 25° C., and
ST2 is a surface energy of the second material at 25° C.

2. The display apparatus of claim 1, wherein the second electrode is disposed in correspondence with the display region and all of the transmissive region,
a first portion of the second electrode is disposed in correspondence with the display region,
a second portion of the second electrode is disposed in correspondence with the transmissive region, and
a thickness of the first portion ($T_1$) and a thickness of the second portion ($T_2$) each satisfy Equation 2 below:

$$T_1 > T_2. \qquad \text{<Equation 2>}$$

3. The display apparatus of claim 2, wherein $T_2$ is greater than about 0 nm and less than about 1 nm or less.

4. The display apparatus of claim 1, wherein the second electrode is disposed in correspondence with the display region and a portion of the transmissive region,
wherein a portion of the second electrode disposed in correspondence with the portion of the transmissive region comprises a plurality of particles comprising the second material.

5. The display apparatus of claim 4, wherein a thickness of the portion of the second electrode disposed in correspondence with the display region is greater than an average diameter of the plurality of particles.

6. The display apparatus of claim 1, wherein ST1 is greater than about 0 mJ/m² and about 30 mJ/m² or less.

7. The display apparatus of claim 1, wherein the first material comprises a fluorine-containing silane compound, a fluorine-based polymer compound, or any combination thereof.

8. The display apparatus of claim 1, wherein the second material comprises magnesium (Mg), silver (Ag,), aluminum (Al), lithium (Li), calcium (Ca), indium (In), or any combination thereof.

9. The display apparatus of claim 1, wherein the display apparatus further comprises a first electrode and an intermediate layer, and
the intermediate layer is disposed between the first electrode and the second electrode.

* * * * *